United States Patent [19]

Fukuda et al.

[11] Patent Number: 5,675,685

[45] Date of Patent: Oct. 7, 1997

[54] OPTICAL SEMICONDUCTOR ARRAY MODULE, METHOD OF FABRICATING THE MODULE, AND EXTERNAL BOARD MOUNTING STRUCTURE OF THE MODULE

[75] Inventors: Kazuyuki Fukuda, Ibaraki-ken; Makoto Shimaoka, Ushiku; Satoshi Kaneko, Yokohama; Kazuhiro Ito, Tokyo; Shinzo Nishiyama, Kamakura; Shigefumi Kito, Fujisawa; Atsushi Takai, Kokubunji; Atsushi Miura, Fujisawa; Koichiro Tonehira, Yokoyama, all of Japan

[73] Assignee: Hitachi Ltd., Tokyo, Japan

[21] Appl. No.: 665,949

[22] Filed: Jun. 19, 1996

[30] Foreign Application Priority Data

Jun. 22, 1995 [JP] Japan .................... 7-155751
Sep. 11, 1995 [JP] Japan .................... 7-232857
Mar. 19, 1996 [JP] Japan .................... 8-062478

[51] Int. Cl.$^6$ .................. G02B 6/00; G02B 6/36
[52] U.S. Cl. .................. 385/89; 257/98
[58] Field of Search .................. 385/88–90, 91, 385/98, 99, 45, 52, 33, 49; 257/81, 88, 82, 79, 98, 99; 372/50; 250/310

[56] References Cited

U.S. PATENT DOCUMENTS

| | | | |
|---|---|---|---|
| 4,628,258 | 12/1986 | Lischke | 250/310 |
| 4,957,342 | 9/1990 | Boudreau et al. | 385/52 |
| 5,204,504 | 4/1993 | Boudreau et al. | 385/33 |
| 5,260,587 | 11/1993 | Sato et al. | 257/88 |

FOREIGN PATENT DOCUMENTS

| | | |
|---|---|---|
| 0 381 370 A2 | 8/1990 | European Pat. Off. . |
| 0 506 438 A1 | 9/1992 | European Pat. Off. . |
| 0 650 082 A1 | 4/1995 | European Pat. Off. . |
| 62-139375 | 6/1987 | Japan . |
| 62-229884 | 10/1987 | Japan . |
| 7 015032 | 1/1995 | Japan . |
| 43 42 840 A1 | 6/1995 | Netherlands . |

OTHER PUBLICATIONS

"Semiconductor Laser Array Module Mounted on a Silicon Substrate by use of Hybrid Integration", K. Miura et al, Electronics Materials, vol. 33, No. 12, 1994, pp. 91–96.
"Optical Parallel Transmission Module", S. Nakaya et al, Oki Research and Development, vol. 62, No. 1, 1995, pp. 67–70.

*Primary Examiner*—Akm E. Ullah
*Attorney, Agent, or Firm*—Antonelli, Terry, Stout & Kraus, LLP.

[57] ABSTRACT

An optical semiconductor array module comprising an optical semiconductor array device constituted by a plurality of semiconductor laser diode, light-emitting diode elements or a plurality of semiconductor photo diode elements, an electronic device for driving and controlling the optical semiconductor array device, a cube-shaped package case for housing the optical semiconductor array device and the electronic device therein, an optical fiber array optically coupled to the optical semiconductor array device, a supporting member for holding and fixing the optical fiber array to one surface of the cube-shaped package case, and a terminal portion having a plurality of pins for electrically connecting an external circuit board to the electronic device. The terminal portion is formed by extending the terminal portion from at least one of surfaces forming the package case, excluding a surface on which the optical semiconductor array device and the electronic device are mounted and a surface opposite to that surface, and the plurality of pins are mounted in a surface of the terminal portion which crosses at right angles with a surface from which the optical fiber array is taken out, whereby the electronic device is mounted on the external circuit board through the plurality of pins and is electrically connected to the external circuit board.

50 Claims, 11 Drawing Sheets

OPTICAL SEMICONDUCTOR ARRAY MODULE, METHOD OF FABRICATING THE MODULE, AND EXTERNAL BOARD MOUNTING STRUCTURE OF THE MODULE

BACKGROUND OF THE INVENTION

1. Field of the Invention

The present invention is used, for example, in optical fiber communications, inter-computer communications, asynchronous transfer mode (ATM) exchanges, inner inter-equipment communications, exchanges, etc., and relates to an optical semiconductor array module provided with a semiconductor laser diode, light-emitting diode array device, a semiconductor photo diode array device, and an optical fiber array optically coupled to these devices, a method of fabricating the optical semiconductor array module, and an external board mounting structure of the optical semiconductor array module.

2. Description of the Prior Art

A conventional technique relating to an optical semiconductor array module is already known in Electronic Materials, Vol. 33, No. 12, 1994.

In an optical semiconductor array module 600 which is shown in the above conventional technique, a semiconductor laser array 63 having a plurality of lasers arrayed on a straight line is aligned on a silicon substrate 65, as shown in the perspective view of FIG. 16. At this time, the semiconductor laser array 63 is assembled on the silicon substrate 65 with markers, formed on the substrate surface by a photolithographic process at the same time as formation of V-shaped grooves for optical fiber alignment, as guides, and is soldered and fixed to the silicon substrate 65 by direct flip-chip bonding.

When, on the other hand, an optical fiber array 64 with a plurality of optical fibers bundled is disposed, the array is arranged by V-shaped grooves (not shown) formed on the aforementioned silicon substrate 65, and also an optical fiber cap board 66 with V-shaped grooves (not shown) is aligned on the silicon substrate 65 and fixed so that the semiconductor laser array 63 and the optical fiber array 64 are optically coupled with each other. In FIG. 16, reference numerals 67 and 68 denote a plurality of wires and a plurality of wire bonding leads, respectively.

Another conventional technique relating to an optical semiconductor array module of this kind is also known in OKI research and development, Vol. 62, No. 1, 1995.

This conventional technique is shown in FIGS. 17A and 17B. In FIG. 17A there is shown a longitudinal sectional view of an optical semiconductor array module 700 taken along line A—A of FIG. 17B. As shown in FIG. 17B, on one end (the right end of the figure) of the case 34 of the module 700, there are aligned a plurality of lead terminals 35 which provide external electrical connections, and from the other end (the left end of the figure) opposite to the lead terminal mounting end, an optical fiber array 36 is taken out.

Along with this, the aforementioned module 700 is assembled so as to be mechanically fixed and mounted by means of four mounting holes 42, which are provided on a surface (i.e., surface of the paper) extending in a direction crossing the aforementioned lead terminals 35 at right angles. In the interior of the case 34, a laser diode (LD) array 31 having a plurality of LDs aligned on a straight line and a monitor photodiode (PD) array 32 having a plurality of PDs aligned on a straight line are mounted through a base 33. On a pipe 39 fixed to the other end (the left end of the drawing) of the case 34, a flat lens array 38 is held and fixed, and on the end of this pipe 39, a metal holder 37 having an optical fiber array 36 embedded therein is directly fixed by YAG laser welding 40a. Consequently, the optical fiber array 36 is optically coupled to the LD array 31 through the flat lens array 38.

The positioning in the optical-axis direction (direction indicated by an arrow A in FIG. 17A), between the LD array 31, the flat lens array 38, and the optical fiber array 36, is performed by precisely processing the pipe 39 to which the aforementioned flat lens array 38 is attached, in the thickness direction, and by putting both the base 33 having the LD array 31 mounted thereon and the metal holder 37 with the optical fiber array 36 against the pipe 39. With this, the positioning alignment operation in the optical-axis direction is performed. Specifically, the optical fiber array 36 is constituted by multi-mode fibers comprising twelve optical fibers. These twelve optical fibers are inserted into V-shaped grooves formed in the top surface of a silicon substrate by anisotropic etching and are arranged, and these arranged fibers are clamped by the aforementioned metal holder 37, which is assembled to the pipe 39 by YAG laser welding. In FIGS. 17A and 17B, reference numeral 40a denotes a point welded by YAG laser welding and reference numeral 40 denotes a soldered portion.

Still another conventional technique relating to the structure of the optical semiconductor array module is also described, for example, in Japanese Patent Unexamined Publication No. 62-139375.

In the structure of an optical semiconductor module 800 of this conventional technique, as shown in a longitudinal sectional view of FIG. 18, a semiconductor laser 43, a spherical lens 44, and a monitoring photodiode 45 are housed in the interior of the module and also an optical fiber 48 is held so as to be optically coupled with respect to a sealed package 47 where a converging type refractive-index profile cylindrical lens 46 is hermetically fixed.

At this time, an optical fiber holding member 49 holding the aforementioned optical fiber 48 is fixed by a support member 50 so that the semiconductor laser 43 is optically coupled to the optical fiber 48 through the aforementioned spherical lens 44 and the aforementioned converging type refractive-index profile cylindrical lens 46. Then, the semiconductor laser module constructed in this way is fixed through a thermo electric cooler 51 to the inner wall surface of a dual in-line package 55 in which pins 54 are mounted in parallel rows along the two long edges of the package.

In such a structure, the optical fiber 48 is taken out to the outside through an optical fiber taking-out hole 57 provided on a surface (the right surface in FIG. 18) perpendicular to the taking-out surface of the pins 54 of the dual in-line package 55 and is hermetically sealed by an optical fiber taking-out member 58. Reference numerals 52 and 53 denote a heat absorption part and a heat spreading part, respectively, and reference numeral 56 denotes a temperature detecting device.

The aforementioned known techniques, however, have the following problems.

That is, the structure of the optical semiconductor array module 600 of the aforementioned first conventional technique is a hybrid module mounting structure where the semiconductor laser array 63 and the optical fiber array 64 are mounted on the silicon substrate 65 so that they are optically aligned with each other. For this reason, in order to ensure the life of the optical alignment between the semiconductor laser array 63 and the optical fiber array 64, they are required to be separated from the outside and hermetically sealed. The above module structure, however, is not a hermetically sealed structure.

In addition, in the hybrid structure where the semiconductor laser array 63 and the optical fiber array 64 are mounted on the silicon substrate 65, the alignment of this module on an external circuit board such as communication equipment or the handling of the module is inconvenient and this hybrid module is not suitable for production.

As a method of solving these problems, there is, for example, a method of housing the silicon substrate 65 into a metal package case. This method, however, gives rise to the following problems: (1) Because the optical fiber array 64 extending from the silicon substrate 65 is of a pigtail type, the sealing of the package case has to be ensured at a connected portion with the package case and therefore hermetically sealing at this connected portion becomes an obstacle, and (2) In a case where the silicon substrate 65 is hermetically sealed in the package case, the semiconductor laser array 63 must be electrically connected to the package case by some method in order to drive the semiconductor laser array 63 mounted on the silicon substrate 65.

Thus, the structure of the optical semiconductor array module 600 of the aforementioned first conventional technique has not devoted sufficient attention to a technique for hermetically sealing an optically coupled portion of the hybrid module where the semiconductor laser array 63 and the optical fiber array 64 are assembled, handling of the hybrid module, or an electrically connecting technique in the case where the hybrid module is mounted in a package case.

In addition, the optical semiconductor array module 700 of the aforementioned second conventional technique has a structure where the LD array 31 and the leads 35 for external electrical connections are assembled on one end (the right end of the drawing) of the case 34 and where the module 700 is mechanically fixed and mounted by the four fitting holes 42 provided on the surface (surface of the paper) extending in the direction crossing the leads 35 at right angles. Therefore, when this module 700 is attached to an external circuit board, it is connected to the external circuit board with the leads 35 protruded from the module 700. For that reason, an area where the leads 35 are connected is further necessary in addition to an area where the module 700 is attached, and consequently, an area where the module 700 is mounted becomes enlarged.

Additionally, for example, in a case where the leads 35 and an external circuit board are soldered, various problems will tend to occur when the leads 35 are mounted due to states of connection, such as a variation in the height adjustment of the leads 35, a variation in the position where the leads are connected to the external circuit board, and furthermore, wettability of solder. In order to spread the heat generated at the time of the drive current of the LD array 31 to the outside so that the LD array 31 is stably operated, it is, for example, considered that the module 700 is directly connected with respect to a spreading member by the four fitting holes 42. However, in that case, the connection of the leads 35 to the external circuit board must also be performed at the same time, and the positioning adjustment, between a position at which the module 700 is attached to the spreading member and a position at which the leads 35 are connected to the external circuit board, must be performed with accuracy.

Also, in a case where the module 700 is mechanically fixed to an external circuit board or a spreading member by four fitting holes 42, the case 34 is undesirably deformed, for example, when foreign substances land on a surface to which the module 700 is attached, when the module 700 is firmly clamped by screws, or when thermal deformation of the external circuit board or spreading member is applied to the case 34. The deformation of the case 34 causes misalignment to occur between the LD array 31 and the optical fiber array 36 which are optically coupled within the case 34, and the misalignment in the optical axis gives rise to a coupling loss in the light output. Particularly, in the case where the LD array 31 which has a plurality of semiconductor laser diode, light-emitting diode elements arranged in a row is optically coupled to the optical fiber array 36 which has a plurality of optical fibers bundled, as compared with a case where a single semiconductor fiber is optically coupled to a single optical fiber, a large quantity of variation in the degradation of the optical coupling caused by misalignment occurs and a difference between the light outputs of the optical fibers varies considerably.

When parallel optical transmission is performed by the optical semiconductor array module 700, the output light beams from the respective optical fibers are required to be uniform. Therefore, if a difference between the output light beams becomes considerably large by optical coupling loss, then it will become a serious obstacle to parallel optical transmission. Thus, in the case of the optical semiconductor array module 700, the misalignment in optical coupling has a great influence on optical transmission. Furthermore, the positioning in the optical-axis direction, between the LD array 31, the flat lens array 38, and the optical fiber array 36, is performed with optical-axis alignment by processing the thickness of the aforementioned pipe 39 with a high degree of accuracy. Therefore, if a position at which the flat lens array 38 is attached to the pipe 39 varies, the focused positions of the laser beams from the flat lens array 38 will change and the incident quantity of the laser beams to the optical fiber array 36 will be reduced. Also, no description is made of how the LD array 31, the flat lens array 38, and the optical fiber array 36 are positioned in the optical-axis and vertical directions. In addition, because a multi-mode fiber is used as the optical fiber 36, the transmission loss of the multi-mode fiber is high in comparison with a single mode fiber, so there is the problem that high-speed and long-distance transmission cannot be made.

Even in the structure of the optical semiconductor array module 700 of the aforementioned second conventional technique, as described above, sufficient consideration has not been given yet as to how the LD array 31 is optically coupled to the leads 35 which are electrically connected to an external circuit, a method of mounting the module 700, how the LD array 31, the flat lens array 38, and the optical fiber array 36 are positioned, and a structure where optical transmission is stably performed.

Furthermore, although the optical semiconductor module 800 of the aforementioned third conventional technique has a structure where the heat generated by the semiconductor laser 43 is discharged from the thermo electric cooler 51, it is better to connect a heat spreading member directly to the wall of the package 55 to which the thermo electric cooler 51 is attached, in order to most efficiently spread heat when the heat from the thermo electric cooler 51 is spreaded to the outside of the package 55.

However, because the spreading surface of the thermo electric cooler 51 is the same surface as the surface to which the dual in-line pins 54 are attached, the pins 54 become an obstacle to spread heat and it is difficult to connect a spreading member directly to the wall of the package 55, so heat cannot be effectively spreaded from the package 55.

Also, in a case where an optical semiconductor array device is mounted, for example, within the dual in-line package 55 having these pins 54, the number of pins corresponding to that optical semiconductor array device is increased to several tens. Therefore, to dispose pins at the same intervals as those of the pins 54, the size of the package 55 becomes large due to the increased number of pins, or to avoid an increase in the size of the package 55, it becomes a package with pins arranged at special narrow intervals and there is the problem that an electrical connection to an external circuit board cannot be generalized because of the special narrow intervals.

Particularly, in a case where the number of fibers is increased, the number of pins is to be increased in correspondence with this and an unnecessary increase in the size of the package cannot be avoided due to an increase in the number of pins. Also, in order to reduce a difference between the propagation delay times of the respective laser beams generated from the optical semiconductor array device, there is the need of equalizing electrical wiring lengths between the optical semiconductor array device and the pins to be electrically connected to an external circuit. In the case of the optical semiconductor array module 700 of the aforementioned second conventional technique, the electrical wiring lengths become nearly the same. But, in the case of the dual in-line pins 54, the electrical wiring length with the optical semiconductor array device varies for each of the pins. For this reason, a difference, between the propagation delay times of the respective laser beams emitted from the optical semiconductor array device, becomes large and becomes an obstacle to parallel optical transmission.

SUMMARY OF THE INVENTION

In view of the problems in the aforementioned conventional techniques, an object of the present invention is to provide an optical semiconductor array module of a novel structure which overcomes such problems found in the conventional techniques, thereby providing an optical semiconductor array module which has an excellent handling ability and also an excellent attaching ability to both an external circuit board and a heat spreading member and which is capable of ensuring the reliabilities of incorporated semiconductor laser diode, light-emitting diode and photo diode array devices, a method of assembling the module, and an external board mounting structure of the module.

More specifically, the optical semiconductor array module is used in a light source for parallel optical transmission performed between computers or equipments by using a plurality of optical fibers, and optically connects an optical semiconductor array device consisting of a plurality of semiconductor laser diode, light-emitting diode and photo diode elements with an optical fiber array consisting of a plurality of optical fibers. At this time, several tens of pins, which are used for being connected to an external circuit board, driving an optical semiconductor array device, and taking out electrical signals, are required in correspondence with the number of elements of the optical semiconductor array device. These pins can be arranged in the same way as a currently used dual in-line pins where terminals are arranged in two parallel rows at intervals of 0.1 inch (2.54 mm) and therefore has the advantage that the pin interval can be used in common. On the other hand, if the number of pins is increased, it will be difficult in a conventional dual in-line pin package case shape to array the pins at the same pin intervals, and a package case structure with special pin intervals will be required.

In addition, in the case of the dual in-line pins, the electrical wiring length with the optical semiconductor array element varies for respective terminals. Therefore, a large difference between propagation delay times will occur in the respective laser beams generated from the optical semiconductor array element and there is a serious obstacle to parallel optical transmission. For this reason, an electrical wiring means or a pin shape becomes necessary where the electrical wiring path lengths to the optical semiconductor array element are made equal to each other.

Furthermore, in attaching the optical semiconductor array module to a circuit board, a method becomes necessary which stably fixes the module concurrently when the pins of the module are electrically connected and also fixes the module mechanically so that no misalignment in optical coupling occurs. Particularly in the optical semiconductor array module, the misalignment in optical coupling has a great influence on optical transmission, so a fixing method where no misalignment occurs is needed. Furthermore, in order to operate stably the light outputs of the optical semiconductor array device, the heat generated at the time of the driving of the element must be effectively discharged outside and therefore a package case structure where attaching of a heat spreading member is taken into consideration becomes necessary.

Accordingly, the present invention proposes an optical semiconductor array module, which is constructed so that a plurality of laser beams from an optical semiconductor array element can be transmitted in parallel at the same time with a plurality of optical fibers while reducing a difference between propagation delay times and also is constructed so that the interval between the pins can be used for being mounted on an external circuit board even if the number of pins is increased. The present invention also proposes an optical semiconductor array module which is assembled so that it can be bonded so that no misalignment occurs for an electrical and mechanical connection and optical coupling and which is constructed so that several tens of pins can be disposed without increasing the size of the module. Furthermore, the present invention proposes an optical semiconductor array module which is assembled so that the heat generated by the optical semiconductor array device and integrated circuit can be effectively spreaded. Moreover, the present invention proposes a method of fabricating the optical semiconductor array module and proposes an external board mounting structure of the optical semiconductor array module.

To achieve the above objects, the optical semiconductor array module of the present invention has any one of the following structures.

The optical semiconductor array module is used in a light source which performs communication between computers or equipment by using an optical fiber. A semiconductor array device consisting of a plurality of semiconductor laser diode, light-emitting diode and photo diode elements is optically coupled to an optical fiber array consisting of a plurality of optical fibers. Tens of electrode pins for being connected to an external integrated circuit board, driving the semiconductor array device, and outputting an electrical signal are needed in correspondence with the number of the elements of the semiconductor array device. If the electrode pins are arrayed in the same intervals as the intervals of a dual in-line package which has been widely used in an integrated circuit board, then the intervals of the electrode pins can be generalized. However, if the number of the electrode pins is increased, a conventional module of the type where electrode pins horizontally extend cannot have the same pin intervals as the dual in-line package and will have special pin intervals.

(1): An optical semiconductor array module comprises an optical semiconductor array device constituted by a plurality of semiconductor laser diode, light-emitting diode elements or a plurality of semiconductor photo diode elements, an electronic device for driving and controlling said optical semiconductor array device, a cube-shaped package case for housing said optical semiconductor array device and said electronic device therein, an optical fiber array optically coupled to said optical semiconductor array device, a supporting member for holding and fixing said optical fiber array to one surface of said cube-shaped package case, means for optically coupling said optical semiconductor array device and said optical fiber array together, and an electrode pin having a plurality of pins for electrically connecting an external circuit board to said electronic device. The pin is formed by extending said pin from at least one of surfaces forming said package case, excluding a surface on which said optical semiconductor array device and said electronic device are mounted and a surface opposite to that surface, and said plurality of pins are mounted in a surface of said lead which crosses at right angles with a surface from which said optical fiber array is taken out, whereby said electronic device is mounted on said external circuit board through said plurality of pins and is electrically connected to said external circuit board.

(2): In the module defined by (1), said terminal portion having said plurality of pins mounted therein is formed by extending said terminal portion from (A) a surface opposite to the surface of said package case from which said optical fiber array is taken out, and/or (B) a plurality of surfaces of said package case, excluding the surface from which said optical fiber array is taken out, and/or (C) a plurality of surfaces of said package case, excluding the surface from which said optical fiber array is taken out and a surface opposite to that surface.

(3): In the module defined by (1), a heat spreading member is attached to the surface of said package case on which said optical semiconductor array device and said electronic device are mounted inside.

(4): In the module defined by (1), said plurality of pins, mounted in said terminal portion, are mounted in (A) a direction of the surface of said package case on which said optical semiconductor array device and said electronic device are mounted, and/or (B) a direction of the surface opposite to the surface of said package case on which said optical semiconductor array device and said electronic device are mounted inside.

(5): In the module defined by (1), said plurality of pins, mounted in the surface of said terminal portion, are arrayed at least two rows.

(6): In the module defined by (1), said plurality of pins, mounted in the surface of said terminal portion, are arrayed at least three rows and three columns.

(7): In the module defined by (5) or (6), the pins, mounted in the surface of said terminal portion, are disposed so that an interval, between the centers of adjacent pins, is between 1.0 mm and 3.0 mm.

(8): In the module defined by (7), the pins, mounted in the surface of said terminal portion, are disposed so that an interval, between the centers of adjacent pins, is 2.54 mm.

(9): In the module defined by (1), said cube-shaped package case where said optical semiconductor array device and said electronic device are housed is isolated from the outside and hermetically sealed.

(10): In the module defined by (1), said terminal portion in which said plurality of pins are mounted is constituted by part of a member which forms part of said package case.

(11): In the module defined by (1), a circuit element for adjusting electric characteristics of said electronic device is attached to a surface opposite to the surface of said terminal portion in which said pins are mounted.

(12): In the module defined by (1), a member, which constitutes part of said package case and has said optical semiconductor array device or said electronic device mounted on the inner surface, is formed by at least one material of an alloy of copper and tungsten, an alloy of aluminum and silicon carbide, aluminum nitride, an alloy of aluminum and silicon, composite metal of copper and invar, and silicon.

(13): In the module defined by (10), a member, which constitutes part of said package case and has a portion which constitutes said terminal portion, is constituted by a multi-layered structure formed with a plurality of boards where an electric wire can be provided on each surface.

(14): In the module defined by (13), the multilayered member, which constitutes part of said package case and said terminal portion, is constituted by a combination of at least one of ceramic, glass, and silicon, and a metal conductor containing a Fe—Ni—Co alloy.

(15): In the module defined by (13), the multilayered member, which constitutes part of said package case and said terminal portion, has electric wires for electrically connecting said optical semiconductor array device and said pins together through said electronic device.

(16): In the module defined by (1), said means for optically coupling said optical semiconductor array device and said optical fiber array together is constituted by a lens array plate where a number of lenses corresponding in number to elements of said optical semiconductor array device are arranged on a line.

(17): In the module defined by (16), said lens array plate is of a generally rectangular flat shape and said plurality of lenses are arranged on the diagonal line of said generally rectangular flat shape at equal intervals.

(18): In the module defined by (16), a lens array plate supporting member for supporting said lens array plate is formed from at least two metallic members consisting of a member to which said lens array plate is directly fixed and a member which is joined and fixed to a side wall of said package case.

(19): An optical semiconductor array module comprising: at least one of optical semiconductor array devices, the devices being constituted by a plurality of semiconductor laser diode, light-emitting diode elements or a plurality of semiconductor photo diode elements; an electronic device for driving said at least one optical semiconductor array device; an optical fiber array optically coupled to said at least one optical semiconductor array device, the optical fiber array being constituted by a plurality of optical fibers for performing optical transmission; a lens array constituted by a plurality of lenses for optically coupling said at least one optical semiconductor array device and said optical fiber array so that they are in an optical transmission relationship; a lens array supporting member for supporting and fixing said lens array, the lens array supporting member being connected to a package where said at least one optical semiconductor array device and said electronic device are housed; and an optical fiber array supporting member for supporting and fixing said optical fiber array, the optical fiber array supporting member being connected to said package through said lens array supporting member. The package, which houses said at least one optical semiconductor array device and said electronic device, is constituted by a heat spreading member on which said at least one optical semiconductor array device is mounted, a multilayered electrode board member on which said electronic device is mounted and which is electrically connected to said at least one optical semiconductor array device through said electronic device, a side wall to which said lens array supporting member is connected and which is provided so as to surround said at least one optical semiconductor array device and said electronic device, and a cap fixed on the top of said side wall so that an inner space defined in said side wall is isolated from the outside. Electrode pins, which are provided on said multilayered electrode board member and are electrically connected to said at least one semiconductor array device, are taken out only from one flat surface of said multilayered electrode board member and are disposed in the same direction as said cap fixed on the top of said package. The heat spreading member is disposed in a direction opposite to the direction in which said electrode pins are taken out.

(20): In the module defined by (19), said electrode pins, provided on said multilayered electrode board member, are arrayed in the same manner as the pin array and pin intervals of electrode pins of a dual in-line package.

(21): In the module defined by (19), said multilayered electrode board member has electric wires for electrically connecting said at least one optical semiconductor array device and said electrode pins together through said electronic device.

(22): In the module defined by (19), said heat spreading member is constituted by at least one material of an alloy of copper and tungsten, copper, and silicon.

(23): In the module defined by (19), said multilayered electrode board member is constituted by at least one material of ceramic, glass, and silicon.

(24): In the module defined by (19), said lens array is of a generally rectangular flat shape and said plurality of lenses are arranged on the diagonal line of said generally rectangular flat shape at equal intervals.

(25): In the module defined by (19), said lens array plate supporting member is formed from at least two metallic members consisting of a member to which said lens array plate is connected and fixed and a member which is joined and fixed to the side wall of said package.

Particularly, the embodiments of the items (19) through (25) are constructed so that the electrode leads can be arrayed at the same intervals as the dual in-line package and also the heat generated by the module can be efficiently spreaded.

(26): An optical semiconductor array module comprises an optical semiconductor array device constituted by a plurality of semiconductor laser diode, light-emitting diode elements or a plurality of semiconductor photo diode elements, an electronic device for driving and controlling said optical semiconductor array device, a cube-shaped package case for housing said optical semiconductor array device and said electronic device therein, an optical fiber array optically coupled to said optical semiconductor array device, a supporting member for holding and fixing said optical fiber array to one surface of said cube-shaped package case, means for optically coupling said optical semiconductor array device and said optical fiber array together, and a terminal portion having a plurality of pins for electrically connecting an external circuit board to said electronic device. Said plurality of pins are mounted in a surface of said terminal portion and are arrayed in the form of a pin grid array where said pins are vertically mounted and arrayed in the form of a grid.

(27): In the module defined by (26), said terminal portion is formed by extending said terminal portion from at least one of surfaces forming said package case, excluding a surface on which said optical semiconductor array device and said electronic device are mounted inside and a surface opposite to that surface, and said plurality of pins are mounted in a surface of said terminal portion which crosses at right angles with a surface from which said optical fiber array is taken out, whereby said electronic device is mounted on said external circuit board through said plurality of pins and is electrically connected to said external circuit board.

(28): In the module defined by (26), said terminal portion having said plurality of pins mounted therein is formed by extending said terminal portion from (A) a surface opposite to the surface of said package case from which said optical fiber array is taken out, and/or (B) a plurality of surfaces of said package case, excluding the surface from which said optical fiber array is taken out, and/or (C) a plurality of surfaces of said package case, excluding the surface from which said optical fiber array is taken out and a surface opposite to that surface.

(29): In the module defined by (26), a heat spreading member is attached to the surface of said package case on which said optical semiconductor array device and said electronic device are mounted inside.

(30): In the module defined by (26), said plurality of pins mounted in said terminal portion are mounted in (A) a direction of the surface of said package case on which said optical semiconductor array device and said electronic device are mounted, and/or (B) a direction of the surface opposite to the surface of said package case on which said optical semiconductor array device and said electronic device are mounted inside.

(31): In the module defined by (26), said plurality of pins, mounted in the surface of said terminal portion, are arrayed in four parallel rows in the same direction as the direction in which said optical fiber array is taken out.

(32): In the module defined by (26), said plurality of pins, mounted in the surface of said terminal portion, are arrayed at least two parallel rows.

(33): In the module defined by (31) or (32), the pins, mounted in the surface of said terminal portion, are disposed so that an interval, between the centers of adjacent pins, is between 1.0 mm and 3.0 mm.

(34): In the module defined by (33), the pins, mounted in the surface of said terminal portion, are disposed so that an interval, between the centers of adjacent pins, is 2.54 mm.

(35): In the module defined by (26), said cube-shaped package case where said optical semiconductor array device and said electronic device are housed is isolated from the outside and hermetically sealed.

(36): In the module defined by (26), said terminal portion in which said plurality of pins are mounted is constituted by part of a member which forms part of said package case.

(37): In the module defined by (26), a circuit element for adjusting electric characteristics of said electronic device is attached to a surface opposite to the surface of said terminal portion in which said pins are mounted.

(38): In the module defined by (26), a member, which constitutes part of said package case and has said optical semiconductor array device and said electronic device mounted on the inner surface, is formed by at least one material of an alloy of copper and tungsten, an alloy of aluminum and silicon carbide, aluminum nitride, an alloy of aluminum and silicon, composite metal of copper and invar, and silicon.

(39): In the module defined by (36), the member, which constitutes part of said package case and has a portion which constitutes said terminal portion, is constituted by a multilayered structure formed with a plurality of boards where an electric sheet can be provided on each surface.

(40): In the module defined by (39), said member, which constitutes part of said package case and has a portion which constitutes said terminal portion and which is constituted by a multilayered structure formed with a plurality of boards where an electric sheet can be provided on each surface, is formed in the form of steps in the interior of the package case so that the electric sheet formed in each board is exposed to a surface of each board, and said electric sheet exposed to each board surface is electrically connected to said electronic device.

(41): In the module defined by (39), the multilayered member, which constitutes part of said package case and has a portion which constitutes said terminal portion, is constituted by a combination of at least one of ceramic, glass, and silicon, and a metal conductor containing a Fe—Ni—Co alloy.

(42): In the module defined by (39), the multilayered member, which constitutes part of said package case and has a portion which constitutes said terminal portion, has electric sheets for electrically connecting said optical semiconductor array device and said pins together through said electronic device.

(43): In the module defined by (26), said means for optically coupling said optical semiconductor array device and said optical fiber array together is constituted by a lens array plate where a plurality of lenses corresponding in number to elements of said optical semiconductor array device are arranged on a line.

(44): In the module defined by (43), said lens array plate is of a generally rectangular flat shape and said plurality of lenses are arranged on the diagonal line of said generally rectangular flat shape at equal intervals.

(45): In the module defined by (43), a lens array plate supporting member for supporting said lens array plate is formed from at least two metallic members comprising a member to which said lens array plate is directly fixed and a member which is joined and fixed to a side wall of said package case.

In addition, to achieve the aforementioned objects, the fabrication method of the present invention has any one of the following structures.

(46): A method of fabricating the optical semiconductor array module as set forth in (19), comprising the steps of:

on the package, which is constituted by the electrode board member provided with said heat spreading member and said electrode pins and said side wall, fixing said at least one optical semiconductor array device at a predetermined position on said heat spreading member; fixing said electronic device at a predetermined position on said electrode board member; and applying wire bonding so that said at least one optical semiconductor array device and said electrode board member are electrically connected together through said electronic device;

adjusting said lens array supporting member supporting and fixing said lens array in a direction of a surface crossing an optical axis at right angles so that an optical axis line of said at least one semiconductor array device becomes aligned with that of said lens array, and then joining and fixing thereto to the side wall of said package;

joining and fixing said cap on the top of said side wall of said package to hermetically seal said at least one semiconductor array device and said electronic device;

emitting a laser beam between said at least one semiconductor array device and said optical fiber array through said lens array and adjusting said optical fiber array in an optical axis direction so that the optical axis line of said at least one semiconductor array device becomes aligned with that of said optical fiber array, and joining and fixing said optical fiber array to said optical fiber array supporting member;

adjusting said optical fiber array supporting member in the direction of the surface crossing the optical axis at right angles; and joining and fixing said optical fiber array supporting member to the side wall of said package through said lens array supporting member.

(47): A method of fabricating an optical semiconductor array module where both an optical semiconductor array device constituted by a plurality of semiconductor laser diode, light-emitting diode elements or a plurality of semiconductor photo diode elements and an electronic device for driving and controlling said optical semiconductor array device are housed in a cube-shaped package case, an optical fiber array inserted in an optical fiber array supporting member is attached to a side surface of said package case, and an end of said optical fiber array is optically coupled to said optical semiconductor array device through a lens array plate having of a plurality of lenses, comprising the steps of:

mounting a board on a side wall forming part of said package case and also on an inner surface of a plate-shaped fixing member forming a bottom portion of said package case, the board forming part of said package case and having a plurality of pins mounted therein and also having said electronic device mounted thereon;

mounting said optical semiconductor array device at a predetermined position on a surface of said plate-shaped fixing member and said electronic device at a predetermined position on a surface of said board;

electrically connecting said optical semiconductor array device and said electronic device together;

attaching said lens array plate supporting member having said lens array plate fixed thereto to said side wall;

attaching a cap on the top of said side wall to hermetically seal an inner space of said side wall;

attaching said optical fiber array fixed to said optical fiber array supporting member to said side surface of said package case;

when said lens array plate supporting member having said lens array plate fixed thereto is attached to said side wall, emitting light from some of a plurality of light-emitting elements of said optical semiconductor array device and adjusting a position of said lens array plate so that the optical axis line of each element of said optical semiconductor array device becomes aligned with that of each lens of said optical fiber array plate and then joining and fixing said lens array plate by welding;

adjusting optical coupling between a laser beam being passed through said lens array plate and said optical fiber array; and joining and fixing said optical fiber array supporting member to the side wall of said package case through said lens array plate supporting member by welding.

In addition, to achieve the aforementioned objects, the external board mounting structure of the optical semiconductor array module of the present invention has any one of the following structures.

(48): An external board mounting structure for mounting the optical semiconductor array module as set forth in (26)

on an external circuit board, wherein a plurality of pins provided in a terminal portion of said optical semiconductor array module are mechanically and electrically connected to said external circuit board and also a heat spreading member is connected and fixed to a surface on which said optical semiconductor array device and said electronic device are mounted.

(49): In the structure defined by (48), said optical semiconductor array module which is mechanically and electrically connected to said external circuit board is connected and fixed only by said plurality of pins provided in the terminal portion of said optical semiconductor array module.

Furthermore, to achieve the aforementioned objects, there is provided a parallel optical transmission system for driving and controlling an optical semiconductor array module to perform parallel optical transmission, wherein the optical semiconductor array module as set forth in claim 1 is used as a communication means or parallel optical transmission means between computers, between exchanges, between an exchange using an optical switch and a box, between boards, between personal computers, and between work stations, or is used as a communication means or parallel optical transmission means for home image communication equipment, communication equipment for games, and vehicle control equipment.

In the optical semiconductor array modules according to (1) through (18) of the present invention constructed as described above, the terminal portion is extended from at least one of the side surfaces of the package case and is formed. On the surface of this terminal portion, the pins corresponding in number to the elements of the optical semiconductor array device are mounted. Therefore, even if the number of the pins is increased, the area of the terminal portion can be increased, and it becomes possible to dispose the pins at desired intervals without increasing the size of the module including the package case. Furthermore, according to the arrayed structure of the terminal portion, there is provided an optical semiconductor array module which can be reliably and firmly attached to an external circuit board. Moreover, the following advantageous effects are obtained.

(a) According to the attached structure of the element of the package case which constitutes the aforementioned optical semiconductor array module, a heat spreading member is connected directly to the surface of the package case on which heat generating elements are mounted, and consequently, the heat generated by the module can be efficiently spreaded.

(b) According to the constitution of the pins disposed on the terminal portion which constitutes the aforementioned optical semiconductor array module, the module is suitable for being mounted on the top surface or under surface of an external circuit board. Furthermore, if the pins are arrayed in the same manner as a pin grid array package which is in general use, then a mounting operation can be simplified and also a mounted structure can be generalized.

(c) By isolating the package case of the aforementioned optical semiconductor array module from the outside and hermetically sealing the package case, the electrical coupling and optical coupling, between the elements housed in the package case, can be satisfactorily held independently of the environment under which the module is used, and the life of the module can be assured. Furthermore, the heat, generated by the elements in the module, can be efficiently spreaded.

(d) By attaching the circuit element for adjusting electric characteristics to a surface opposite to the surface of the terminal portion of the aforementioned optical semiconductor array module in which pins are mounted, it becomes possible to simply adjust the electric characteristics even after each element of the module is hermetically sealed.

(e) The material of each member which constitutes the aforementioned optical semiconductor array module is excellent in heat transfer rate, and the heat generated by the elements in the module can be efficiently spreaded. The aforementioned terminal portion having pins mounted therein is constituted by a multilayered structure formed by stacking a plurality of boards where an electric wire can be provided on each surface. With this, attaching of elements becomes easy and the length of the electric wire can be shortened. Particularly, high-speed and high-frequency driving of the optical semiconductor array device can be performed. With the material of the multilayered board, a welding defect in the board can be prevented when the multilayered board is welded and fixed.

(f) According to the electric wiring structure which constitutes the aforementioned optical semiconductor array module, the wiring distance between the elements mounted in the module becomes shortest, and particularly, high-speed and high-frequency driving of the optical semiconductor array device becomes possible.

(g) Means for optically coupling the optical semiconductor array device and optical fiber array of the aforementioned optical semiconductor array module is constituted by a lens array plate where a plurality of lenses corresponding in number to the elements of the optical semiconductor array device are arranged on a line. The lens array plate is of a generally rectangular flat shape, and a plurality of lenses of the lens array plate are arranged on the diagonal line of the generally rectangular flat shape at equal intervals. With the use of the lens array plate, better optical coupling is obtained. The lens array plate supporting member for supporting the lens array plate is formed from two metallic members. This makes it possible to reliably join and fix the lens array plate supporting member to the side wall of the package case which constitutes the optical semiconductor array module.

In the optical semiconductor array modules according to (19) through (25) of the present invention, the package for housing a semiconductor laser diode, light-emitting diode and photo diode element array and an electronic device is constituted by a heat spreading member, a multilayered electrode board member, a side wall, and a cap fixed on the top of the side wall. The semiconductor laser diode, light-emitting diode and photo diode element array is optically coupled to the optical fiber array through the lens array joined and fixed to the side wall of the package.

More specifically, the lens array supporting member having the lens array fixed thereto is connected to the side wall of the package so that the space in the package is isolated from the outside, and the optical fiber array, which is optically coupled to the semiconductor laser diode, light-emitting diode and photo diode element array mounted inside the package, is disposed outside the package. Furthermore, the cap is fixed on the top of the side wall of the package. With this arrangement, the optically coupled portion, between the semiconductor laser diode, light-emitting diode and photo diode element array, the electronic device, and the lens array, can be isolated from the outside and hermetically sealed.

In addition, the semiconductor laser diode, light-emitting diode and photo diode element array is electrically connected to the electrode pins provided on the electrode board member through the electric wiring formed on the multilayered electrode board member, whereby bonding lines can be shortened and also can be easily attached. Moreover, high-speed and high-frequency driving of the semiconductor laser diode, light-emitting diode and photo diode element array can be performed.

Furthermore, the electrode pins, which are electrically connected to the semiconductor laser diode, light-emitting diode and photo diode element array, are taken out only from one flat surface of the multilayered electrode board member. With this, the electrode pins do not need to be taken out horizontally from both sides of the package as a conventional technique does. A plurality of electrode pins can be formed on the top surface of the electrode board member in the same manner as the pin array and pin intervals of a dual in-line package. Therefore, the mounting of the electrode leads to currently used IC boards can be generalized.

In addition, the heat spreading member can be provided in the direction opposite to the direction in which the electrode leads are taken out, whereby a connection to a module fixing member, provided with an integrated circuit board and heat spreading fins, can be performed through the top and under surfaces of the module. Therefore, the mounting of the module to an integrated circuit board and the heat spreading of the module can be easily and efficiently performed. Furthermore, by forming the module into a box shape, handling and operability can be facilitated.

In the optical semiconductor array modules according to (26) through (45) of the present invention, the terminal portion is extended from at least one of the side surfaces of the package case and is formed. On the surface of this terminal portion, the pins corresponding to the number of the elements of the optical semiconductor array device are mounted. Therefore, even if the number of the pins were increased, the area of the terminal portion could be increased, and it becomes possible to dispose the pins at desired intervals without increasing the size of the module including the package case. Furthermore, the distances to the elements of the optical semiconductor array device can be shortened and the same, whereby there is provided stable parallel optical transmission where a difference between the propagation delay times of the elements of the optical semiconductor array device is small.

According to the arrayed structure of the terminal portion, the module is suitable for being disposed and mounted on an external circuit board. Also, the terminal portion with pins which is fixed to an external circuit board is disposed away from the optically coupled portion between the LD array and the optical fiber array, and the module is fixed only by pin grid array terminals. This arrangement provides an optical semiconductor array module where no misalignment in an optically coupled portion occurs when the module is fixed and which can be reliably and firmly attached to an external circuit board.

Moreover, the following advantageous effects will be obtained.

(a) According to the attached structure of the element of the package case which constitutes the aforementioned optical semiconductor array module, a heat spreading member is connected directly to the surface of the package case on which heat generating elements are mounted, and consequently, the heat generated by the module can be efficiently spreaded.

(b) According to the constitution of the pins disposed on the terminal portion which constitutes the aforementioned optical semiconductor array module, the module is suitable for being mounted on the top surface or bottom surface of an external circuit board. Furthermore, if the pins are arrayed in the same manner as a pin grid array package which is in general use, then a mounting operation can be simplified and also a mounted structure can be generalized.

(c) According to the constitution of the pins disposed on the terminal portion which constitutes the aforementioned optical semiconductor array module, the pins are arrayed in at least two parallel rows in a package case with a size of 12.7 mm wide which is widely used and is becoming a standard type. Also, by arraying pins in four parallel rows, the pins corresponding to the number of the elements of the optical semiconductor array device can be suitably and effectively arrayed in a size of 12.7 mm wide. Furthermore, the pins can be arrayed without increasing the size of the package case.

(d) By isolating the package case of the aforementioned optical semiconductor array module from the outside and hermetically sealing the package case, the electrical coupling and optical coupling, between the elements housed in the package case, can be satisfactorily held independently of the environment under which the module is used, and the life of the module can be assured. Furthermore, the heat, generated by the elements in the module, can be efficiently spreaded.

(e) By attaching the circuit element for adjusting electric characteristics to a surface opposite to the surface of the terminal portion of the aforementioned optical semiconductor array module in which pins are mounted, it becomes possible to simply adjust the electric characteristics even after each element of the module is hermetically sealed.

(f) The material of each member which constitutes the aforementioned optical semiconductor array module is excellent in heat transfer rate, and the heat generated by the elements in the module can be efficiently spreaded. The aforementioned terminal portion having pins mounted therein is constituted by a multilayered structure formed by stacking a plurality of boards where an electric wire can be provided on each surface. Furthermore, the multilayered board is formed in the form of steps in the interior of the package case. Accordingly, the elements can be easily attached and connected and the lengths of the electric wires can be shortened and uniform. Therefore, particularly, high-speed and high-frequency driving of the optical semiconductor array device can be made possible. In addition, stable parallel optical transmission, where a difference between the propagation delay times of the elements of the optical semiconductor array device is small, can be performed. Furthermore, with the material of the multilayered board, a welding defect in the board can be prevented when the multilayered board is welded and fixed.

(g) According to the electric wiring structure which constitutes the aforementioned optical semiconductor array module, the multilayered board is formed in the form of steps in the interior of the package case. Accordingly, the elements can be easily connected, and the lengths of the electric wires, between the optical semiconductor array device and the pin, can be shortened and nearly uniform. Therefore, particularly, high-speed and high-frequency driving of the optical semiconductor array device can be made possible. In addition, stable parallel optical transmission, where a difference between the propagation delay times of the elements of the optical semiconductor array device is small, can be performed.

(h) Means for optically coupling the optical semiconductor array device and optical fiber array of the aforementioned optical semiconductor array module is constituted by a lens array plate where a plurality of lenses corresponding to the number of the elements of the optical semiconductor array device are arranged in a line. The lens array plate is of a generally rectangular flat shape, and a plurality of lenses of the lens array plate are arranged on the diagonal line of the generally rectangular flat shape at equal intervals. With the use of the lens array plate, better optical coupling is obtained. The lens array plate supporting member for supporting the lens array plate is formed from two metallic members. This makes it possible to reliably join and fix the lens array plate supporting member to the side wall of the package case which constitutes the optical semiconductor array module.

According to the method of fabricating an optical semiconductor array module of (46) and (47) of the present invention, the optical semiconductor array device, housed in the package case constituting the optical semiconductor array module, is aligned with the optical fiber array with a high degree of accuracy and then they are joined and fixed. Also, the package case can be hermetically sealed. Therefore, an optical semiconductor array module, which has better optical characteristic and where reliability in interior elements are assured, is obtainable.

According to the external board mounting structure of the optical semiconductor array module of (48) and (49) of the present invention, pin grid array terminals are used as pins which are provided in the terminal portion of the optical semiconductor array module. The package case is not connected directly to an external circuit board but is mechanically and electrically connected through the pin grid array terminals. Furthermore, the terminal portion with the pins is positioned away from the optically coupled portion between the optical semiconductor array device and the optical fiber array, and at that position, the module is fixed. With this arrangement, no deformation of the package case occurs when the package case is mounted to the external circuit board, and stable optical transmission where no misalignment in the optically coupled portion occurs is obtained.

According to the parallel optical transmission system which performs parallel optical transmission by driving and controlling the optical semiconductor array module of the present invention proposed in the foregoing, high-speed and high-frequency driving of the optical semiconductor array device and parallel optical transmission are made possible. In addition, stable optical transmission can be performed while preventing misalignment of the optical coupling. Furthermore, a mounting area to a board can be reduced. Therefore, by mounting a plurality of optical semiconductor array modules on an external circuit board, there is provided a parallel optical transmission system which is used as a communication means or parallel optical transmission means, such as computers or exchanges which optically transmit large amounts of data in parallel. Even if a plurality of optical semiconductor array modules are mounted on an external circuit board, the same parallel optical transmission system can be obtained.

Now, a detailed description will hereinafter be made of the arrayed shape of the pins of the optical semiconductor array module proposed in the foregoing.

In the case of IC packages, a dual in-line package (DIP), a plastic leaded chip carrier (PLCC), a quad flat package (QFP), a pin grid array (PGA), and a ball grid array (BGA) are known as a shape of a lead pin which provides a mechanical and electrical connection. In parallel transmission, the lengths of wires in a package are required to be short and uniform because a high-speed operation and simultaneity of each signal are required.

With respect to this purpose, butterfly types, PGAs, and BGAs, where the lengths of wires can be easily shortened, are suitable, and PLCCs, QFPs, PGAs, and BGAs, where the lengths of wires can be easily made uniform, are suitable. DIPs with terminals arranged in parallel rows are unsuitable because the lengths of wires differ at the central and opposite terminals. The optical semiconductor module is characterized in that it has optical fibers mounted thereon and also has an optical coupling structure therein. If the package case is deformed, then the optical coupling position, between the optical fibers, the lenses, and the laser diodes, will change and therefore optical coupling degradation will take place and stable optical transmission cannot be performed.

This phenomenon will become conspicuous in the optical semiconductor array module which performs a plurality of optical couplings. On the other hand, in the package case structure with lead or pins of the PLCC, QFP, and butterfly types, the module needs to be fixed by an additional fastening means such as screws, because the package case is easily separated from the board in a case the package case is fixed only by the adhesive force of the terminals soldered to the board. When the module is fixed by screws, there is the danger of the package case being deformed due to overtightening of screws, misalignment in screw holes, and strain caused by thermal deformation of the board. Thus, this package case structure is not suitable particularly as a package case for the optical semiconductor array module.

Also, in the case of the BGA, the package case can be fixed by a strong firm adhesive force if soldering balls are provided over the entire bottom surface. However, since soldering balls are also provided near optical fibers, the optical fibers are heated concurrently when soldering balls are soldered, and consequently, there is possibility that heat generated will have an influence on the melting of the cover of the optical fiber or the life of the optical fiber.

On the other hand, in the case of the PGA, a sufficient firm adhesive force is obtained because pins are inserted through the board and are joined. Pins can be provided near optical fibers and the package can be held and fixed reliably and firmly. In addition, because the module is fixed to the board through pins, screwing the module becomes unnecessary and eliminating deformation of the package case becomes possible. The PGA, as described above, can be formed so that the lengths of electric wires are short and uniform, and therefore can realize parallel optical transmission. Furthermore, replacing can be easily performed by using IC sockets.

Thus, the PGA terminal shape can be said to be particularly suitable as a shape of the pins for meeting the requirements of the optical semiconductor array module that tens of pins need to be arranged, parallel optical transmission can be made, a plurality of optical couplings can be stably performed, and furthermore the mounting of the package on the board can be performed easily and reliably.

In addition, when the PGA terminals are used in the optical semiconductor array module, they need to be arranged at intervals of 0.1 inch (2.54 mm) so that an electrical connection to an external circuit board can be generalized. On the other hand, a package case with a size of 12.7 mm wide, which is widely used and is becoming a standard type, is suitable for generalization. In the package case of 12.7 mm wide, if pins are arranged in the form of a grid, they can be maximally arranged in five rows at intervals of 0.1 inch. But, since space is used for connecting the package case and the pins together, a sufficient distance to the side wall of the package case cannot be assured. Particularly, for a portion which constitutes a package case where pins are disposed, a multilayered ceramic board is used in many cases. In this case, if a distance to the side wall of the package case is insufficient, there will be the possibility that the ceramic board will crack. On the other hand, the minimum rows of the pins are three rows because they are arranged in the form of a PGA terminal. However, in the case of three rows, a distance to the side wall of the package case becomes longer. Therefore, when a module is mounted on the board, there is the danger that the fixing of the module will become unstable, and since the number of rows of pins is reduced, the number of pins in each row is necessarily increased and the size of the module is to be increased.

Then, it is most preferable that pins are arrayed in four rows. In this four-row array, a sufficient distance to the side wall of the package case is obtained and also a module can be stably mounted on a board. Moreover, pins can be efficiently arrayed without increasing the size of the module.

From these facts it is found, in a case where PGA terminals are mounted on the optical semiconductor array module and also the width of a package case is 12.7 mm, that in order to array pins in the form of a grid at intervals of 0.1 inch, the terminals arrayed in four rows are in an optimum structure of arrays. When a plurality of pins are arrayed in the same way as the form of a pin grid array terminal in a case other than a package case with a size of 12.7 mm wide, for example, when pins are arrayed in package cases having sizes of 15.24 mm, 17.8 mm and 25.4 mm increased at intervals of 0.1 inch, it is preferable in either case that pins are arrayed in four parallel rows or more at intervals of 0.1 inch and also the maximum rows of pins meet an equation of (width of package case+2.54−1). Furthermore, pins may be arrayed in rows where the module can be stably connected and fixed mechanically and electrically to an external circuit board only by the pins.

Accordingly, the present invention provides an optical semiconductor array module which has an excellent handling ability and also an excellent attaching ability to both an external circuit board and a heat spreading member and which is capable of ensuring reliability in an optical semiconductor array device. The present invention also provides an optical semiconductor array module constructed so that a plurality of laser beams from an optical semiconductor array device can be transmitted in parallel at the same time while reducing a difference between propagation delay times and also constructed so that the mounting of the pins on an external circuit board could be generalized even if the number of pins were increased. Furthermore, the present invention provides an optical semiconductor array module constructed so that it can be electrically and mechanically connected while preventing misalignment and also constructed so that several tens of terminal pins can be disposed without increasing the size of the module. Moreover, the present invention provides an optical semiconductor array module constructed so that the heat generated by the optical semiconductor array device can be effectively spreaded. Finally, the present invention provides a method of fabricating the aforementioned optical semiconductor array module and provides an external board mounting structure of the aforementioned optical semiconductor array module.

The above and other objects and advantages of the present invention will become apparent from the following detailed description when read in conjunction with the accompanying drawings.

DETAILED DESCRIPTION OF THE PREFERRED EMBODIMENTS

Figure 1:
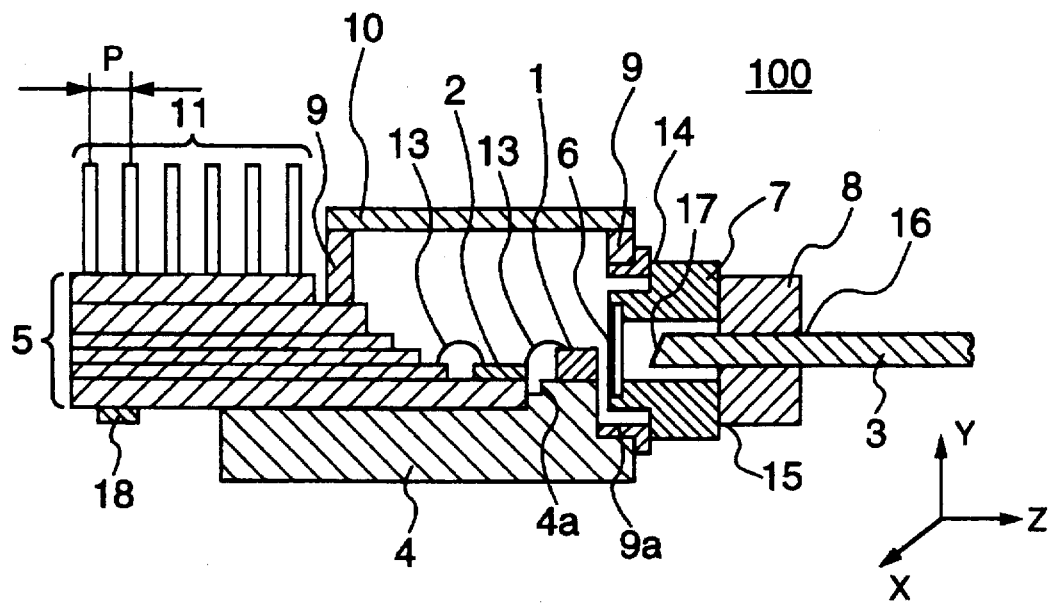
FIG. 1 is a sectional view taken along line I—I of FIG. 2 showing the internal structure of an optical semiconductor array module which is a first embodiment of the present invention.

Preferred embodiments of the present invention will hereinafter be described in detail while referring to the drawings. In the following description some wire bonding leads and electric wires are not illustrated for the purpose of avoiding the complexity of the description.

First, a first embodiment of the present invention will be described with FIGS. 1 through 3.

Figure 2:
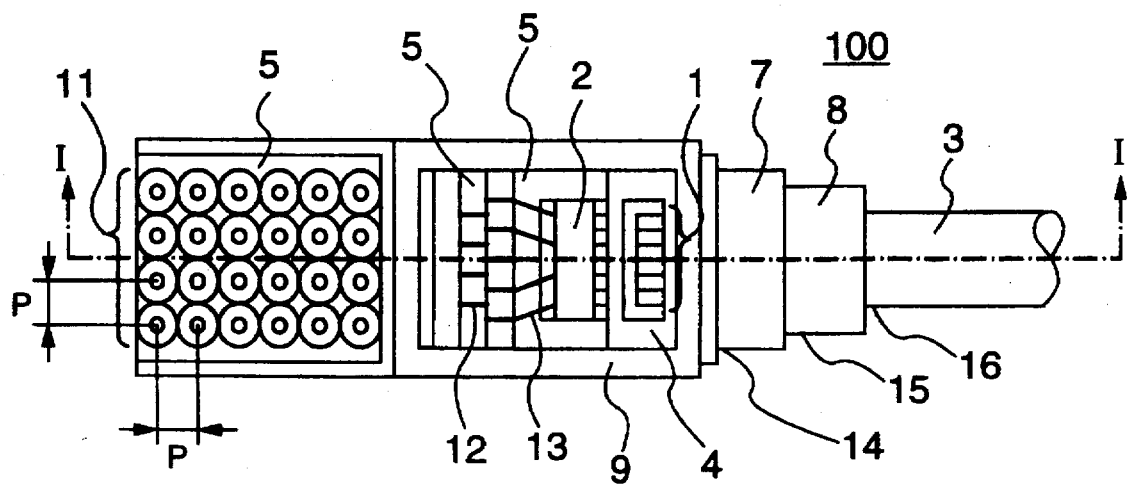
FIG. 2 is a plan view of the optical semiconductor array module which is the first embodiment of the present invention.
Figure 3:
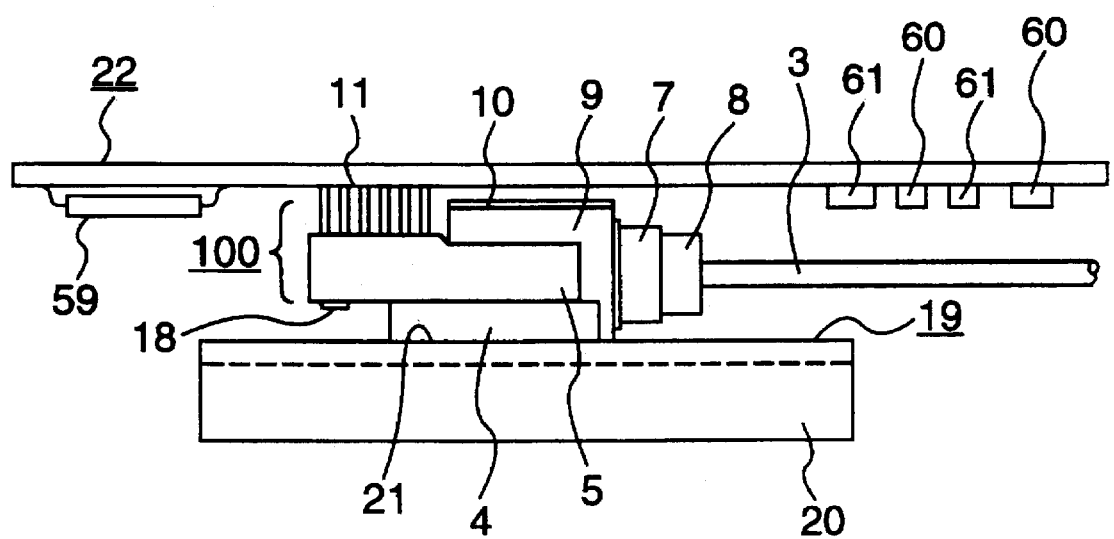
FIG. 3 is a side view showing the mounting structure of the optical semiconductor array module of the first embodiment of the present invention to an external board.

In these figures, the mounted structure of an optical semiconductor array module 100 in this embodiment is shown in FIG. 3 and the internal detailed structure of the optical semiconductor array module 100 is shown in FIGS. 1 and 2. A sectional view shown in FIG. 1 is a sectional view taken along sectional line I—I in a plan view of the optical semiconductor array module 100 shown in FIG. 2.

In FIG. 3 the optical semiconductor array module 100 is attached to (the bottom surface of) an external circuit board 22 by means of a plurality of pins 11 so that the module 100 can be connected mechanically and electrically to the board 22. More specifically, in the package case of this optical semiconductor array module 100, an optical fiber array 3 including a plurality of optical fibers is taken out from one surface (the right surface of the figure) of a plurality of surfaces forming the package case. On a surface opposite to the surface from which the optical fiber array 3 is taken out, part of the package case of the optical semiconductor array module 100 is extended to form a terminal portion, and on a surface (in this embodiment an upper surface) of the terminal portion crossing at right angles with the surface from which the optical fiber array 3 is taken out, the aforementioned plurality of pins 11 are mounted and disposed.

Incidentally, roughly speaking, the package case of the optical semiconductor array module 100 in this embodiment is constituted by a stem 4 which is a device fixing member for mounting a laser diode array 1 thereon, an interior circuit board 5 fixed on the stem 4, a side wall 9 where the laser diode array 1, etc., are housed and also a lens array plate supporting member 7 is joined and fixed, and a cap 10 fixed on the top end of the side wall 9. Specifically, the optical fiber array 3, optically coupled to the laser diode array 1 through the lens array plate supporting member 7 and an optical fiber array guide 8, is taken out from one end surface (the right end surface of the figure) of the side wall 9 of the package case. From the other surface the terminal portion extends, and on the surface of the terminal portion which crosses at right angles with the surface from which the optical fiber array 3 is taken out, the aforementioned plurality of pins 11 are mounted and disposed.

According to such a structure, the optical semiconductor array module 100 is mounted to the external circuit board 22 through the plurality of pins 11, and also the laser diode array and the drive control circuit, housed in the interior of the package case, are electrically wired. Also, on the external circuit board 22 there are mounted various devices, such as an LSI 59, a transistor 60, and capacitors 61. Between these devices and the optical semiconductor array module 100, an electrical signal is input and output.

On the other hand, in the optical semiconductor array module 100, a heat spreading member 19 with heat spreading fins 20 is mounted on a surface (a lower surface of the figure) opposite to the surface from which the pins 11 connected to the external circuit board 22 is taken out, so that the heat spreading member is connected directly to the module 100.

In the optical semiconductor array module 100 constructed in this way, it is preferable, when the module 100 is mounted in various kinds of equipment, that in the state where the module 100 with the heat spreading member 19 is mounted on the external circuit board 22, that is, the total thickness of the optical semiconductor array module 100, the heat spreading member 19, and the external circuit board 22, for example, will be less than 13.5 mm.

Also, as described above, the terminal portion, having a plurality of pins 11 mounted on the surface crossing at right angles with the surface from which the aforementioned optical fiber array 3 is taken out, is not attached directly to a surface (upper and lower surfaces of the drawing) crossing at right angles with the aforementioned optical fiber array taking-out surface of the package case constituting the aforementioned optical semiconductor array module 100, but, rather, from the side opposite to this optical fiber array taking-out surface, the terminal portion extends so as to be away from the optically coupled portion between the laser diode array 1 and the optical fiber array 3, and the pins 11 are mounted on the surface which crosses at right angles with the surface from which the optical fiber array is taken out, whereby the portion in which these pins 11 are mounted is separated from the package case housing the laser diode array or from the optically coupled portion.

According to the aforementioned structure, even in a case where several tens of pins 11 are needed, only the area of the terminal portion in which the pins are mounted is increased without increasing the size of the package case and it becomes possible to avoid an increase in the size of the entire optical semiconductor array module 100. At the same time, because the optical semiconductor array module 100 is not connected directly to the board 22 but is mechanically and electrically connected through the pins 11, no deformation of the package case occurs when the package case is mounted to the board, and stable optical coupling having no misalignments is obtained.

The interior structure of the optical semiconductor array module 100 where the mounted structure was described in the foregoing will next be described in detail in reference to FIGS. 1 and 2. In the optical semiconductor array module 100 shown in these figures, a plurality of pins (electronic leads) 11 for facilitating the aforementioned attaching to the external circuit board 22 are arranged in four parallel rows in the same direction as the direction where the optical fiber array 3 is taken out, and are arranged in the form of a lattice at pin 11 intervals of 0.1 inch (2.54 mm) so that they are arranged in the same way as a pin-grid array. The optical semiconductor array module 100 is also constructed into a box-shaped package case so that the heat spreading member 19 with the heat spreading fins 20 can be connected directly to a surface opposite to the surface of the aforementioned external circuit board 22 to which the terminals 11 are attached.

The optical semiconductor array module 100 is used for transmitting, for example, transmission data of twelve channels at the same time. Roughly speaking, the optical semiconductor array module 100 is provided with the laser diode array 1 and the optical fiber array 3 optically coupled to the laser diode array for performing optical transmission. The laser diode array 1 is constituted, for example, by twelve semiconductor laser diode, light-emitting diode elements, such as laser diodes, arranged in a row at equal intervals. The optical fiber array 3 is constituted, for example, by twelve single-mode optical fibers arranged in a row at equal intervals. The optical semiconductor array module 100 is further provided with a lens array plate 6 having a plurality of lenses arranged on a flat plate so that the laser diode array 1 and the optical fiber array 3 are in an optical transmission relationship, an integrated circuit (IC) 2 electrically connected to the laser diode array 1 for controlling the array 1, and a stem 4. The stem 4 forms part of the package case where the laser diode array 1 and the IC 2 are housed and is also a device fixing member where the laser diode array 1 is mounted on the surface. The optical semiconductor array module 100 is further provided with an interior circuit board 5 consisting of a multilayer structure, a lens array plate supporting member 7, an optical fiber array guide 8, and a cap 10. The interior circuit board 5 forms part of the package case, has the aforementioned IC 2 mounted on the surface, and is provided with a plurality of pins 11 for an electrical connection with the laser diode array 1. The lens array plate supporting member 7 supports and fixes the lens array plate 6 and is joined and fixed to the side wall 9 which forms part of the package case provided so as to surround the aforementioned laser diode array 1 and IC 2. The optical fiber array guide 8 supports and fixes the optical fiber array 3 and is joined and fixed to the side wall 9 of the package case through the lens array plate supporting member 7. The cap 10 is fixed to the top of the side wall 9 of the package case so that the aforementioned laser diode array 1 and IC 2 are hermetically sealed.

Part of the interior circuit board 5 of multilayer structure which forms part of the package case, as described above, projects from the side wall 9 of the aforementioned package case and is extended, and on the top surface a plurality of pins 11 are mounted in the form of a pin-grid array terminals. In this way, the aforementioned terminal portion is constructed.

As described above and as also evident in FIGS. 1 and 2, on the top surface of the stem 4 which forms part of the package case housing the laser diode array 1 and the IC 2, there are provided both the interior circuit board 5 of a multilayer structure, which is electrically connected to the laser diode array 1 and has the IC 2 mounted thereon and is provided with a plurality of pins 11, and the side wall 9 formed so as to surround the laser diode array 1 and the IC 2. On the top of the opening portion of the side wall 9, the cap 10 is fixed so that the inner space of the side wall 9 is isolated from the outside.

The side wall 9 is provided with a through hole 9a through which the lens array plate supporting member 7 supporting and fixing the lens array plate 6 is inserted. The through hole 9a and the lens array plate supporting member 7 are joined and fixed so that the inner space of the side wall 9 is isolated from the outside. It is preferable that a difference in thermal expansion coefficient, between a metal material constituting the through hole 9a of the side wall 9 to which the lens array plate supporting member 7 is joined and fixed and a metal material constituting the lens array plate supporting member 7, be less than $3 \times 10^{-6}/°C$. In this embodiment, stainless steel, SUS 430, is used.

The members constituting the side wall 9 and the through hole 9a are joined and fixed by silver soldering. Also, on one end of the lens array plate supporting member 7 joined and fixed to the side wall 9, the optical fiber array guide 8 supporting and fixing the optical fiber array 3 is joined and fixed. Note that since a single-mode fiber is used as an optical fiber, high-speed and long-distance transmission can be realized with low transmission loss, and large-capacity transmission can be achieved by the module.

At a predetermined position on the top surface of the stem 4, the laser diode array 1 is fixed. On the other hand, at a predetermined position on electric wiring (not shown) formed on the top surface of the interior circuit board 5 so as to be electrically connected to the laser diode array 1, the aforementioned IC 2 is mounted. The laser diode array 1 is electrically connected to the electric wiring 12 of the interior circuit board 5 through the IC 2 by the wire bonding leads 13. Also, the aforementioned interior circuit board 5 comprises a multilayered board formed with material consisting, for example, of ceramic and a metal conductor, and on part of this interior circuit board 5, a plurality of pins 11 are disposed for being electrically connected to an external circuit.

The plurality of pins 11, as described above, are in four parallel rows in the direction where the optical fiber array 3 is taken out, and are disposed in the same form as a pin-grid array terminals where pins are arrayed in the form of a lattice at intervals of 0.1 inch (2.54 mm). More specifically, the interval (P in FIG. 2) between the pins 11 is an interval between the centers of adjacent pins 11 and is between 1.0 mm and 3.0 mm. To improve the common specification of the connection to the external circuit board 22, it is preferable that the pins 11 be arrayed at 0.1-inch intervals. In this embodiment, the interval (P in FIG. 2) of the pins 11 is taken to be 2.54 mm.

In the multi-layer interior circuit board 5 with the plurality of pins 11, electric wires electrically connected to the aforementioned IC 2 are formed in a plurality of layers constituting the interior circuit board 5, respectively. According to this arrangement, a signal, input from the pins 11 through the interior circuit board 5 to the IC 2, is input to the laser diode array 1 through the wire bonding lead 13. The interior circuit board 5 is formed in the form of steps in the interior of the package case so that the electric wire formed in each layer is exposed to the layer surface. The electric wire on each surface of the stepped shape is electrically connected to the IC 2 by the wire bonding lead 13. The electric wires formed in the respective layers of the interior circuit board 5 are formed so that the lengths of the electric wires are short and become almost the same between each of the pins 11 and the laser diode array 1 through the IC 2.

The stem 4 and the interior circuit board 5 are joined and fixed by silver soldering. To prevent silver solder from flowing onto the surface to which the laser diode array 1 is attached, when the stem 4 and the board 5 are joined and fixed, a recessed-shape groove 4a is formed between the portion of the stem 4 to which the laser diode array 1 is attached and the interior circuit board 5. Furthermore, in this embodiment the interior circuit board 5 is constructed so that part of the wiring of the interior circuit board 5 is exposed to the back surfaces of the pins 11.

Thus, since part of the wiring of the interior circuit board 5 is exposed, part of the exposed wiring of the interior circuit board 5 is electrically connected to the pins 11 and also to the laser diode array 1 or the IC 2, and it becomes possible to attach a circuit element 18 for changing the wiring resistance of the IC 2. Accordingly, this embodiment can be constructed so that the adjustment and control of an electric signal, for example, between the laser diode array 1, the IC 2, and the pins 11, can be changed from the outside. Also, in this embodiment, an alloy (CuW) of copper (Cu) and tungsten (W) having high heat spreading is used as a metallic material which constitutes the stem 4.

The lens array plate supporting member 7 is provided with a square or circular through-hole at the central portion thereof and is in a generally two-step cylindrical shape consisting of a small-diameter portion and a large-diameter portion. On the end surface of the small-diameter portion of the lens array plate supporting member 7, the lens array plate 6 is joined and fixed by a low melting point glass composed of PbO and $B_2O_3$ so that the member 7 and the plate 6 are hermetically sealed.

For the lens array plate supporting member 7, the distance, between the surface of the stepped portion of the lens array plate supporting member 7 and the end surface of the lens array plate 6, is previously adjusted and constructed so that there is a predetermined distance between the laser beam emitting portion of the laser diode array 1 and the laser beam receiving portion of the lens array plate 6. Also, it is preferable that a difference in thermal expansion coefficient, between the metallic material constituting the lens array plate supporting member 7 and the glass material constituting the lens array plate 6, be less than $3\times10^{-6}/°C$. In this embodiment, stainless steel SUS 430, made by a metal injection molding method which sinters and molds metal powder, is used.

The optical fiber array guide 8 is in a generally cylindrical shape provided with a central through-hole through which the optical fiber array 3 is supported and fixed. The optical fiber array 3 is in a square shape, but a portion to which the optical fiber array guide 8 is attached is in a circular shape. The circular portion of the optical fiber array 3 is inserted into the through hole of the optical fiber array guide 8 and is fixed.

The optical fiber array 3 has a laser beam incident end 17 at one end thereof. The laser beam incident end 17 is inclined and polished so that a laser beam, reflected at the incident end 17 of the optical fiber array 3, is prevented from returning to the laser diode array 1 again. It is preferable that the inclined surface of the incident end 17 of the optical fiber array 3 is inclined at an angle of 4 degrees or more. In this embodiment, the inclined surface of the incident end 17 is inclined at an angle of eight degrees.

While the incident end 17 of the optical fiber array 3 shown in FIG. 1 has been formed so that the inclined surface is directed toward the upper cap 10, the present invention is not limited to this upwardly directed surface. Even if the incident end 17 were formed so that the inclined surface is directed downward toward the stem 4, the same advantageous effect as the foregoing would be obtainable.

In addition, in this embodiment the gap, between the inner diameter of the through-hole provided in the optical fiber array guide 8 and the outer diameter of the optical fiber array 3, is μ meters in counts of tens, i.e., 10, 20, 30, . . . , 90. By gap accuracy such as this, the optical fiber array 3 is prevented from being tilted in the through-hole of the optical fiber array guide 8. As metallic materials constituting the optical fiber array 3 and the optical fiber array guide 8, stainless steel SUS 430 is used. Also, in this embodiment, the optical fiber array 3 and the optical fiber array guide 8 have been made by metal machining, but instead of this, they may also be made by metal injection molding, which sinters and molds metal powder.

The fabrication method or procedure of the optical semiconductor array module 100 where the detailed constitution has been described in the foregoing, and the mounted structure of the module will next be described. First, the interior circuit board 5 having pins 11 mounted in part thereof and the side wall 9 are mounted on the stem 4 to form a package case. Thereafter, to house and mount the laser diode array 1 and the IC 2 in the package case, the laser diode array 1 is fixed at a predetermined position on the top surface of the stem 4.

On the other hand, the IC 2 is fixed at a predetermined position on the electric wiring formed on the interior circuit board 5. The electric wiring 12 exposed to the stepped surfaces of the interior circuit board 5 is connected to the IC 2 by the wire bonding lead 13, and the IC 12 is likewise connected to the laser diode array 1 by the wire bonding lead 13. For example, marks, including marking-off lines, grooves, or laser marks, are provided on the top surface of the stem 4 to precisely mount the laser diode array 1 at the predetermined portion when it is fixed, and with these marks, the end portion of the laser diode array 1 is positioned and fixed. In this case, since an optical coupling state is determined by the positional relationship between the incident end 17 of the optical fiber array 3 attached by the optical fiber array guide 8 and the lens array plate 6 to be described also in the following, it is desirable that the mounting of the laser diode array 1 is performed with a positional accuracy of ±3 μm with respect to a predetermined position.

Subsequently, the lens array plate supporting member (lens holder) 7 having the lens array plate 6 attached thereto is inserted into the through hole 9a provided in the side wall 9 which constitutes the package case. At this time, current is supplied to the laser diode array 1 to generate a laser beam, whereby the optical axis line of the laser diode array 1 is aligned with that of the lens array plate 6. That is, the position of the lens array plate supporting member 7 in contact with the side wall 9 of the package case is adjusted in the direction (X—Y direction in FIG. 1) on a plane which crosses the optical axis at right angles by an image observing means so that the optical coupling between the supporting member 7 and the side wall 9 is in an optimum state. At this time, it is preferable that the distance, between the step surface of the intermediate portion of the lens array supporting member 7 and the end surface of the lens array plate 6, is adjusted beforehand so that a distance, between the laser emitting portion (in FIG. 1 the right end) of the laser diode array 1 fixed on the stem 4 and the laser beam receiving portion of the lens array plate 6, becomes a predetermined length.

The alignment in the optical coupling, between the laser diode array 1 and the lens array plate 6, is performed by observing the laser beams being passed through the opposite lenses of a plurality of lenses arrayed on the lens array plate 6 and then concentrically forming the laser beams being passed through the opposite lenses onto the corresponding lens, respectively.

After such a positional adjustment of the lens array plate supporting member 7, the step surface of the intermediate portion of this lens array plate supporting member 7 is joined and fixed to the side wall 9 which constitutes the package case. This joining and fixing is done by welding the entire circumference of the lens array plate supporting member 7, for example, by YAG laser welding 14. Thereafter, the cap 10 is placed on the top of the side wall 9 which constitutes the package case, and is joined and fixed by seam welding. Accordingly, the laser diode array 1, the IC 2, and the optically coupled portion between the laser diode array 1 and the lens array plate 6, housed in the interior of the package case, can be isolated from the outside and hermetically sealed.

Next, the optical fiber array guide 8 having the optical fiber array 3 inserted therein is placed on the end surface of the lens array plate supporting member 7 fixed to the side wall 9 of the package, and the optical fiber array 3 is optically coupled to the laser diode array 1 through the lens array plate 6 attached to the lens array plate supporting member 7. Furthermore, the position of the optical fiber array 3 inserted in the optical fiber array guide 8 is adjusted in the optical-axis direction (Z direction in FIG. 1) so that the axial line of the laser diode array 1 is aligned with that of the optical fiber array 3 through the lens array plate 6 and also this optical coupling is in an optimum state. After the adjustment of the optical coupling in this optical axis direction, the optical fiber array 3 is joined and fixed to the optical fiber array guide 8 by YAG laser welding. The portion joined and fixed by this YAG laser welding is designated by reference numeral 16.

Thereafter, optical coupling is again performed between the laser diode array 1 and the optical fiber array 3 through the lens array plate 6, and the position of the optical fiber array guide 8 in contact with the end surface of the lens array plate supporting member 7 is adjusted in the direction (X—Y direction in FIG. 1) which crosses the optical axis at right angles so that the optical coupling is in an optimum state. Finally, after the adjustment of the optical coupling in the optical axis direction, the optical fiber array guide 8 is joined and fixed to the lens array plate supporting member 7 by YAG laser welding. The portion joined and fixed by this YAG laser welding is designated by reference numeral 15.

The array shape of a plurality of pins 11 arranged on the optical semiconductor array module 100 will hereinafter be described in detail. In the case of IC packages, a dual in-line package (DIP), a plastic leaded chip carrier (PLCC), a quad flat package (QFP), a pin grid array (PGA), and a ball grid array (BGA) are known as a shape of a lead pin which provides a mechanical and electrical connection. In parallel transmission, the lengths of wires in a package need to be short and uniform because a high-speed operation and simultaneity of each signal are required. With respect to this purpose, butterfly types, PGAs, and BGAs, where the lengths of wires can be easily shortened, are suitable, and PLCCs, QFPs, PGAs, and BGAs, where the lengths of wires can be easily made uniform, are suitable. DIPs with terminals arranged in parallel rows are unsuitable because the lengths of wires differ at the central and opposite terminals.

The optical semiconductor module is characterized in that it has optical fibers mounted thereon and also has an optical coupling structure. If the package case is deformed, then the optical coupling position, between the optical fibers, the lenses, and the laser diodes, will change and therefore optical coupling degradation will take place and stable optical transmission cannot be performed. This phenomenon will become conspicuous in the optical semiconductor array module 100 where a plurality of optical couplings are performed.

On the other hand, in the package case structure with lead or pins of the PLCC, QFP, and butterfly types, the module needs to be fixed by an additional fastening means such as screws, because the package case is easily separated from the board in a case the package case is fixed only by the adhesive force of the terminals soldered to the board. When the module is fixed by screws, there is the danger of the package case being deformed due to overtightening of screws, misalignment in screw holes, and strain caused by thermal deformation of the board. Thus, this package case structure is not suitable particularly as a package case for the optical semiconductor array module 100.

Also, in the case of the BGA, the package case can be fixed by a strong firm adhesive force if soldering balls are provided over the entire bottom surface. However, since soldering balls are also provided near optical fibers, the optical fibers are heated concurrently when soldering balls are soldered, and consequently, there is possibility that heat generated has an influence on the melting of the cover of the optical fiber or the life of the optical fiber. On the other hand, in the case of the PGA, a sufficient firm adhesive force is obtainable because pins are inserted through the board and are joined. Pins can be provided near optical fibers and the package can be held and fixed reliably and firmly. In addition, because the module is fixed to the board through pins, screwing the module becomes unnecessary and eliminating deformation of the package case becomes possible.

The PGA, as described above, can be formed so that the lengths of electric wires are short and uniform and therefore can realize parallel optical transmission. Furthermore, replacing can be easily performed by using IC sockets. Thus, the PGA terminal shape can be said to be excellent as a shape of the pins 11 for meeting the requirements of the optical semiconductor array module 100 that tens of pins need to be arranged, parallel optical transmission can be made, a plurality of optical couplings can be stably performed, and furthermore the mounting of the package on the board can be performed easily and reliably.

In addition, when the PGA terminals are used in the optical semiconductor array module, they need to be arranged at intervals of 0.1 inch (2.54 mm) so that an electrical connection to an external circuit board can be generalized. On the other hand, a package case with a size of 12.7 mm width, which is widely used and is coming to be standardized, is suitable for generalization. In the package case of 12.7 mm width, if pins 11 can be arranged in the form of a grid, they can be maximally arranged in five rows at intervals of 0.1 inch. But, since space is used for connecting the package case and the pins 11 together, a sufficient distance to the side wall of the package case cannot be assured.

Particularly, in a portion which constitutes a package case where pins 11 are disposed, a multilayered ceramic board is used in many cases. In this case, if a distance to the side wall of the package case is insufficient, there will be the possibility that the ceramic board will crack.

On the other hand, the minimum rows of the pins 11 are three rows because they are arranged in the form of a PGA terminal. However, in the case of three rows, a distance to the side wall of the package case becomes longer. Therefore, when a module is mounted on the board, there is the danger that the fixing of the module will become unstable, and since the number of rows of pins 11 is reduced, the number of pins in each row is necessarily increased and the size of the module is to be increased. Then, it is most preferable that pins be arrayed in four rows. In this four-row array, a sufficient distance to the side wall of the package case is obtainable and a module can be stably mounted on a board. Furthermore, pins 11 can be efficiently arrayed without increasing the size of the module.

From these facts it is found, in a case where PGA terminals are mounted on the optical semiconductor array module 100 and also a package case has a size of 12.7 mm, that in order to array pins in the form of a grid at intervals of 0.1 inch, the terminals arrayed in four rows are in an optimum array shape of the pins 11.

When a plurality of pins 11 are arrayed in the same way as the form of a pin grid array terminal in a case other than a package case with a size of 12.7 mm width, for example, on package cases having sizes of 15.24 mm, 17.8 mm and 25.4 mm increased at intervals of 0.1 inch in the form of a grid, it is preferable in either case that pins are arrayed in four parallel rows or more at intervals of 0.1 inch and also the maximum rows of pins meet an equation of (width of package case+2.54−1). Furthermore, pins 11 may be arrayed in rows where the module can be stably connected and fixed mechanically and electrically to the external circuit board 22 only by the pins 11.

For the optical semiconductor array module 100 where the details of the interior structure, the fabrication method, and the mounted structures of the elements in the module have been described, as has been described in FIGS. 1 through 3, a plurality of pins 11 which constitute pin grid array terminals are mounted in any one of four surfaces, excluding a surface opposite to the surface on which the laser diode array 1 and the IC 2 are directly mounted inside, among a plurality of surfaces of the package case which constitutes the aforementioned optical semiconductor array module 100. In this embodiment, the plurality of pins 11 which constitute pin grid array terminals are mounted in the surface of the terminal portion, which extends from a surface opposite to the surface from which the optical fiber array 3 is taken out and also crosses at right angles with the surface from which the optical fiber array 3 is taken out. With this arrangement, it becomes possible to avoid an increase in the entire size of the optical semiconductor array module 100 without increasing the size of the package case even if the number of pins 11 were increased.

In addition, the pin grid array terminals are arrayed at a position away from the optically coupled portion between the laser diode array 1 and the optical fiber array 3, and also the module 100 is not fixed directly to the external circuit board 22 but is mechanically fixed through the pin grid array terminals. Therefore, deformation of the package case, which is caused by external force when the module 100 is mounted on the external circuit board 22, can be eliminated and also stable optical transmission with no misalignment in the optical coupling is obtainable. Also, since the module 100 is fixed to the external circuit board 22 by the pin grid array terminals constituted by a plurality of pins 11, the optical semiconductor array module 100 can be fixed reliably and firmly.

Furthermore, the heat spreading member 19 with heat spreading fins 20 is connected directly to a surface opposite to the surface to which the aforementioned external circuit board 22 is attached, among the surfaces of the package case constituting the aforementioned optical semiconductor array module 100, that is, to the bottom surface of the stem 4 to which heat generating bodies, such as the laser diode array 1 and the IC 2 for driving the laser diode array 1, are attached. Accordingly, the heat generated in the module 100 can be efficiently discharged outside although pin grid array terminals are provided.

Note that it is most preferable that the heat spreading member 19 is attached to the surface on which the heat generating bodies are mounted, among a plurality of surfaces of the package case which constitutes the optical semiconductor array module 100.

Figure 4:
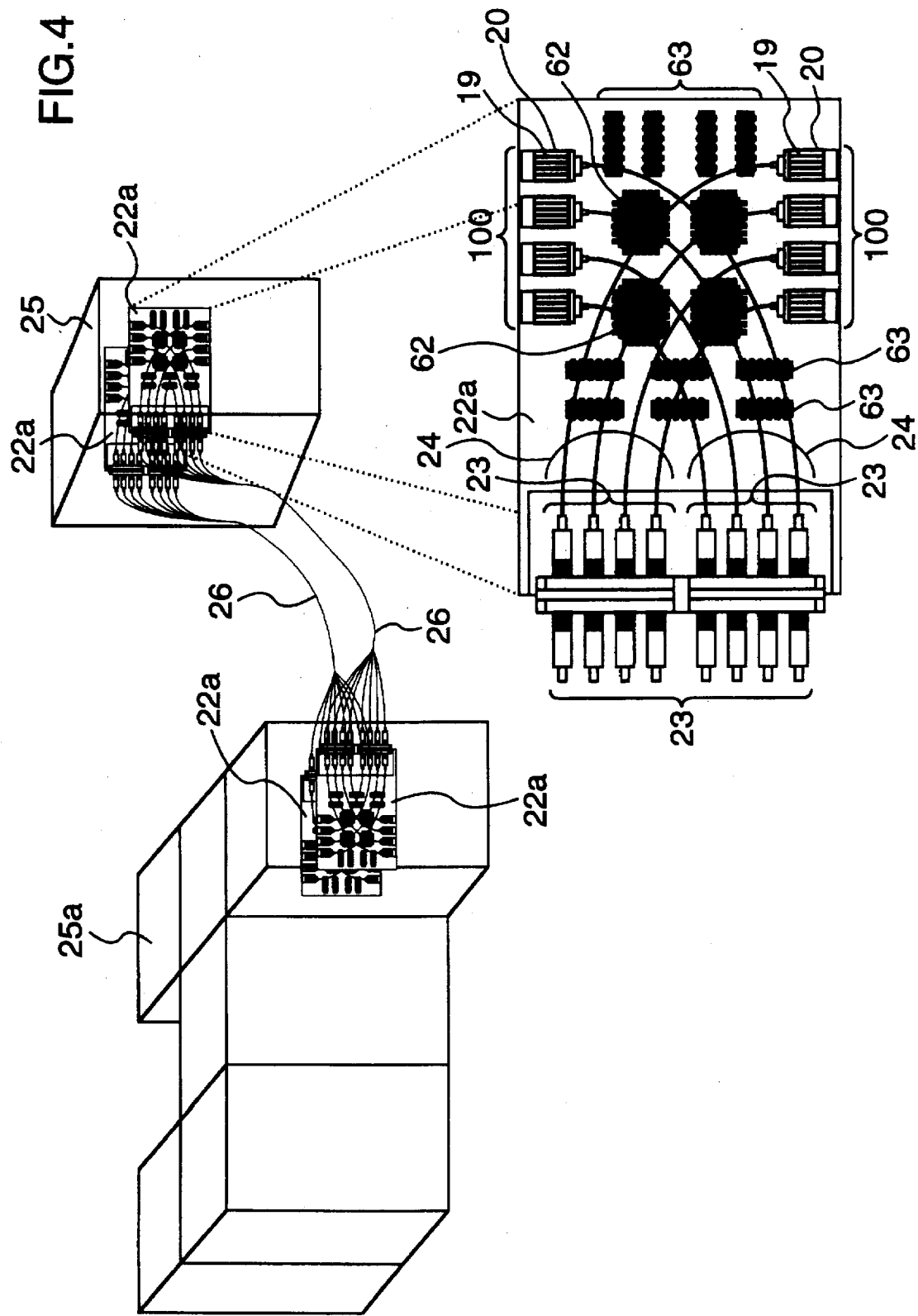
FIG. 4 is a schematic view showing a parallel optical transmission system of optical semiconductor array modules constituted by using the optical semiconductor array module of FIG. 1 in a quantity of a plurality of numbers at the same time.

While a single optical semiconductor array module 100 has been described in detail, a plurality of optical semiconductor array modules can be used at the same time when needed. FIG. 4 shows the structure of a plurality of optical semiconductor array modules 100 mounted on an external circuit board 22a and also a system where parallel optical transmission is performed by the optical semiconductor array modules 100 mounted on the external circuit board 22a. Thus, even when a plurality of optical semiconductor array modules are used at the same time, they become structurally simple.

A detailed description will be made of a case where a plurality of optical semiconductor array modules 100 are used at the same time. The plurality of optical semiconductor array modules 100 are attached to a single external circuit board 22a, and heat spreading members 19 are attached to these modules, respectively. That is, the respective optical semiconductor array modules 100 are electrically and mechanically connected to the external circuit board 22a through pins 11 which constitute pin grid array terminals, and structurally in the form of surface mounting, the modules 100 are mounted on the surface of the board 22a and the driving control and signal processing of the laser diode arrays 1 in the modules are performed.

The aforementioned spreading member 19 is provided with the spreading fins 20, whereby the heat, generated by the laser diode array 1 and the IC 2, is efficiently spreaded outside and stable optical transmission can be performed. Note that LSIs 63, an MPU, and CPUs 62, which input and output an electrical signal to the optical semiconductor array modules 100, and a plurality of optical connectors 23, which are optically connected to an external board, are mounted on one end of the board 22a, respectively. The optical connectors 23 correspond in number to the optical fibers which constitute an optical fiber array 24 connected and fixed to the optical semiconductor array module 100. For example, in the case of the optical fiber array 24 constituted by twelve optical fibers bundled, it is suitable that MPO connectors are used on the ends of the optical fibers, and MPO connectors are mounted in correspondence with the number of the optical semiconductor array modules 100 mounted on the board 22a.

If a plurality of optical semiconductor array modules 100 are mounted and used in the external circuit board 22a at the same time, as described above, the number of transmission channels can be increased to several times as compared with the case of a single semiconductor array module and also a large amount of transmission data can be transmitted at a high speed in a parallel manner. In addition, the external circuit boards 22a each having a plurality of optical semiconductor array modules 100 mounted thereon, as shown in the top of FIG. 4, are used, for example, as parallel optical transmission means between a device 25 and a device 25a, between computers, between exchanges, between an exchange using an optical switch and a box, between boards, between personal computers, and between work stations, or are used as communication means or parallel optical transmission means for home image communication equipment, communication equipment for games, and vehicle control equipment, whereby a large quantity of transmission data can be transmitted at a high speed in a parallel manner, as in the above case, and furthermore, optical transmission can be made without being influenced by external noise, because data is transmitted with light.

While it has been described in FIG. 4 that a plurality of the aforementioned optical semiconductor array modules 100 are mounted and used in the board 22, there would be no problem even if a single optical semiconductor array module is mounted on the board 22a and used, depending upon purposes or circumstances where it is used. In addition, by connecting the devices 25 and 25a together with optical array codes 26 constituted by bundling a plurality of optical fiber arrays 24, areas on which the devices 25 and 25a are mounted can be effectively used and also wiring can be simplified.

The optical semiconductor array module 100 in the first embodiment of the present invention described in FIGS. 1 through 4 is accordingly constructed as follows. That is, in the optical semiconductor array module 100 constructed as described above, the package case having the laser diode array 1 and the IC 2 housed therein is constructed by the stem 4, the multilayered interior circuit board 5, the side wall 9, and the cap 10 fixed on the top of the side wall 9, and the laser diode array 1 is optically coupled to the optical fiber array 3 through the lens array plate 6 joined and fixed to the side wall 9 of the package case.

The lens array plate supporting member 7 having the lens array plate 6 fixed thereto is fixed to the side wall 9 of the package case by welding the entire circumference at the welding portion 14 so that the interior space of the package case is isolated from the outside. Also, the optical fiber array 3, optically connected to the laser diode array 1 mounted in the interior of the package case, is disposed outside the package case. Furthermore, by fixing the cap 10 on the top of the side wall 9 of the package case by seam welding, the electrically coupled portion between the laser diode array 1 mounted in the interior of the package case and the IC 2 and the optically coupled portion between the laser diode array 1 and the lens array plate 6 can be hermetically sealed so that the coupled portions can be isolated completely from the outside.

Particularly, a plurality of pins 11 which are electrically connected to the laser diode array 1 are arrayed on the interior circuit board 5 in four parallel rows in the same direction as the direction where the optical fiber array 3 is taken out, and the pins 11 are disposed in the same way as a pin grid array package where pins are arrayed in the form of a grid at intervals of 0.1 inch. With this, the pins can be integrated and arrayed on the same surface of the interior circuit board 5, and with such a constitution, tens of pins 11 can be arrayed without increasing the size of the module 100.

Thus, by constituting the pins 11 in the same way as a pin grid array package which has widely been used, the connection of the module 100 to the external circuit board 22 can be generalized. In addition, since the pins 11 are arrayed at a position away from the optically coupled portion between the laser diode array 1 and the optical fiber array 3 and also the module 100 is electrically and mechanically connected and fixed to the external circuit board 22 only by the pin grid array terminals, no deformation of the package case occurs when the module 100 is mounted on the external circuit board 22 and also stable optical transmission with no misalignment in the optical coupling is obtainable.

Furthermore, by directly connecting the heat spreading member 19 with the heat spreading fins 20 to the bottom surface 21 of the stem 4 which is a surface opposite to the surface from which the pins 11 are taken out, the external circuit board 22 to which the pins 11 are connected becomes no obstacle and the heat spreading member 19 can be attached. Accordingly, the heat generated by the laser diode array 1 can be efficiently discharged outside.

The pins 11 provided on the interior circuit board 5 is electrically connected to the laser diode array 1 through the electric wiring 12 and IC 2 formed on the multilayered board which constitutes the interior circuit board 5. According to the aforementioned structure, the wire bonding lead 13 can be shortened and easily mounted, and the laser diode array 1 can be driven at a high speed with high frequency. Moreover, the electric wires formed in the layers of the interior circuit board 5 are adjusted so that the lengths of the electric wires become the same between the plurality of pins 11 and the laser diode array 1. Accordingly, a difference in propagation delay time, between the laser beams emitted from the elements of the laser diode array 1, can be made smaller and stable parallel optical transmission can be performed. In addition, by forming the module 100 into a box-shaped package case, handling and operability can be made easier.

The material of the side wall 9 having the through-hole 9a formed in part thereof and the metallic materials, which constitute the lens array plate supporting member 7 and the optical fiber array guide 8, are constituted by the same metallic material so that the portions 14, 15, and 16 welded by YAG laser welding are constituted by the metallic material of the same kind. Accordingly, welding cracks and welding defects can be prevented when YAG laser welding is performed. At the same time, no thermal stress would occur even if the temperature of the module 100 changes, and stable optical coupling is obtainable. Furthermore, by mounting a plurality of optical semiconductor array modules 100 on the board 22a and using them at the same time, a large amount of transmission data can be transmitted at a high speed in a parallel manner and also stable optical transmission can be obtained without being influenced by external noise.

Thus, according to the aforementioned structure and fabrication method of the optical semiconductor module 100 in the first embodiment of the present invention, the handling and the mounting to the external circuit board 22 and heat spreading member 19 are excellent and the reliability of the laser diode array 1 can be ensured. Also, a difference between propagation delay times is reduced and parallel transmission can be performed. In addition, even if the number of pins 11 is increased, the mounting of the module 100 to the external circuit board 22 can be generalized, the module 100 can be electrically and mechanically connected to the external circuit board 22, and the module 100, with no misalignment in optical coupling, can be fixed. Furthermore, the optical semiconductor array module 100, constructed so that tens of pins 11 can be disposed without increasing the size of the module 100 and also constructed so that the heat generated by the laser diode array 1 and the IC 2 can be efficiently spreaded, is obtainable.

In the aforementioned first embodiment, the lens array plate supporting member 7 and the optical fiber array guide 8 have been joined and fixed with the joined portion 15 by YAG laser welding, and the optical fiber array 3 and the optical fiber array guide 8 have been joined and fixed with the joined portion 16 by YAG laser welding. By fixing the entire circumferences of the joined portions by YAG laser welding or with solder, the optically coupled portion, between the lens array plate 6 and the optical fiber array 3, can be isolated from the outside and also can be hermetically sealed. That is, by obtaining the optical semiconductor array module 100 where the optical coupled portion, between the laser diode array 1 including the IC 2 and the optical fiber array 3, is completely isolated from the outside and hermetically sealed, the life of the laser diode array 1 or IC 2 which is the interior device of the module 100 would not be reduced even if the module 100 is used under high-temperature and high-humidity environment or high-temperature environment.

Subsequently, a second embodiment of the optical semiconductor array module of the present invention will be described with FIGS. 5 through 7. This second embodiment, as evident in these figures, adopts a structure where pins 11 on an interior circuit board 5 are provided on a surface which is in the same direction as a surface where a spreading member 19 is attached to a bottom surface 21 of a stem 4.

Figure 5:
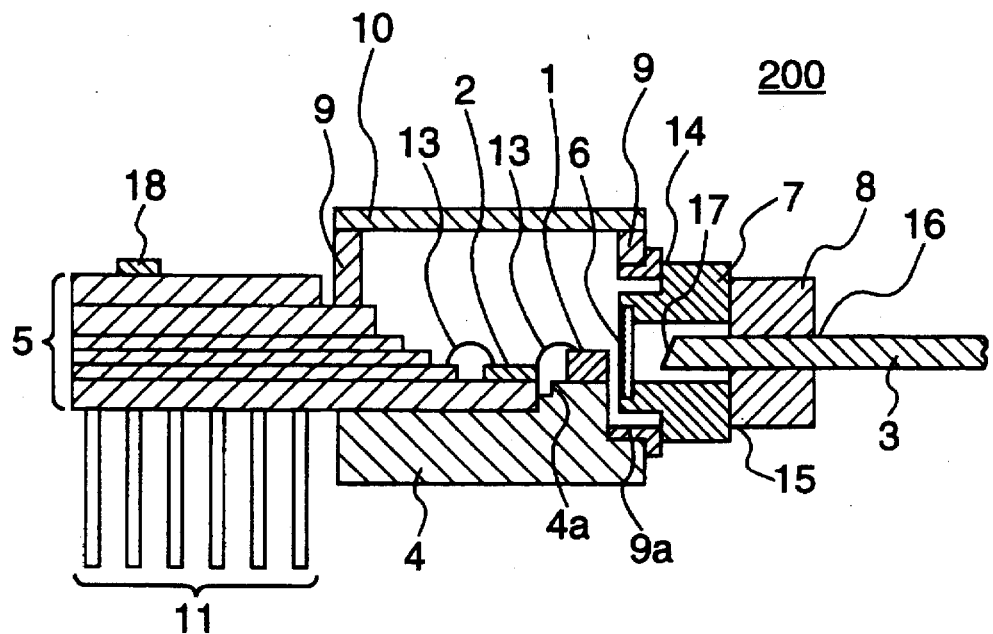
FIG. 5 is a sectional view taken along line V—V of FIG. 6 showing the structure of an optical semiconductor array module which is a second embodiment of the present invention.
Figure 6:
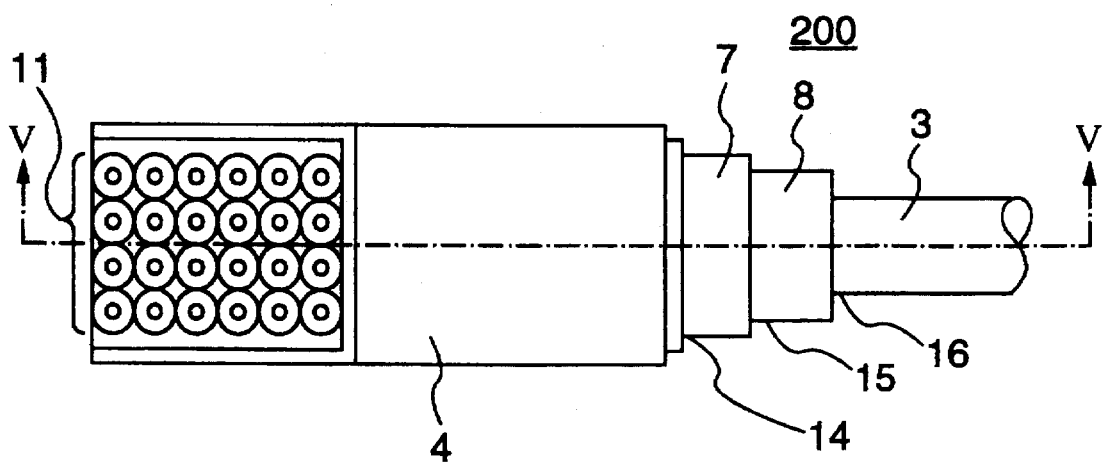
FIG. 6 is a plan view showing the optical semiconductor array module which is the second embodiment of the present invention.

The structure of an optical semiconductor array module 200 is shown in a sectional view of FIG. 5 and a plan view of FIG. 6. The sectional view of FIG. 5 shows a section taken along line V—V of FIG. 6. FIG. 7 is a side view showing the mounted structure of the optical semiconductor array module 200 shown in FIGS. 5 and 6. In this second embodiment, the same reference numerals will be applied to parts identical with or equal to those shown in FIGS. 1 through 4.

In the optical semiconductor array module 200 shown in FIGS. 5 and 6, the main point differing from the aforementioned first embodiment is that the direction in which the pins 11 electrically connected to an external circuit board 22 is taken out is the same as that of the bottom surface 21 of the stem 4 to which the heat spreading member 19 is attached. That is, a plurality of pins 11 which are disposed on the interior circuit board 5 are taken out in the same direction as the bottom surface 21 of the stem 4 on which a laser diode array 1 is mounted.

The plurality of pins 11, as with the aforementioned embodiment, are arranged on the interior circuit board 5 in four parallel rows in the same direction as the direction where the optical fiber array 3 is taken out, and are arranged in the same way as a pin grid array package where pins are arrayed in the form of a grid at intervals of 0.1 inch. Also, from the aforementioned structural difference, a circuit element 18 for adjusting and controlling the laser diode array 1 and IC 2 mounted within the package case, as shown in FIG. 5, is to be mounted on a surface opposite to the surface from which the pins 11 on the interior circuit board 5 are taken out.

Figure 7:
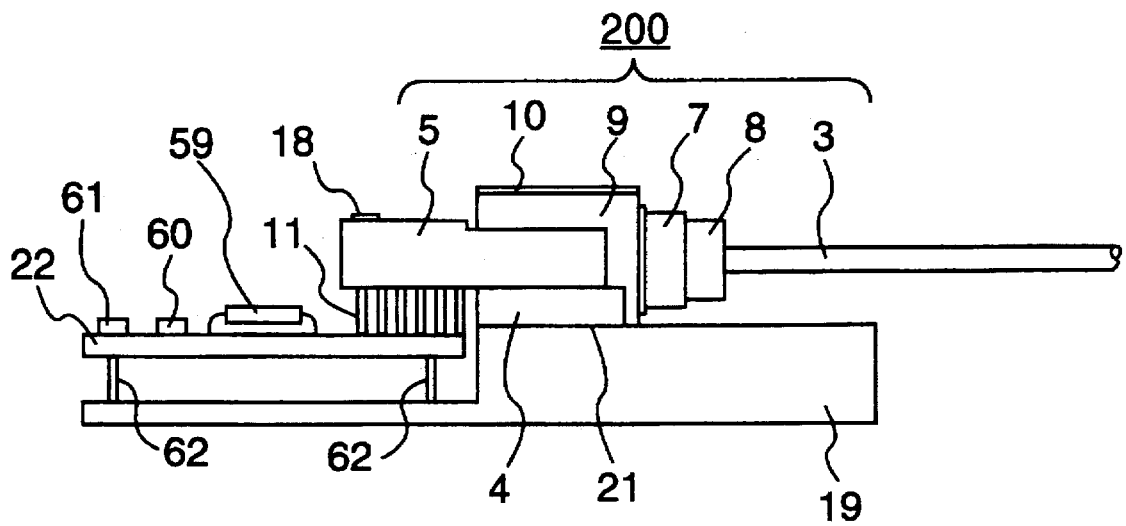
FIG. 7 is a side view showing the mounting structure of the optical semiconductor array module of FIG. 6 to an external board.

In FIG. 7, the optical semiconductor array module 200 is electrically and mechanically attached to the external circuit board 22 through a plurality of pins 11 provided on a surface crossing at right angles with the surface from which the optical fiber array 3 connected to one end of the package case is taken out. Also, the heat spreading member 19, provided with heat spreading fins 20 on a surface in the same direction as the surface from which the pins 11 connected to the external circuit board 22 are taken out, is directly connected and mounted to the module 200. That is, in the optical semiconductor array module 200 consisting of such a structure, the external circuit board 22 and the heat spreading member 19 are attached so as to be provided in the same surface direction.

For that reason, the external circuit board 22 which is electrically connected to a plurality of pins 11, as shown in FIG. 7, has been previously connected to the heat spreading member 19 provided with the heat spreading fins 20, and the module 200 is attached to the heat spreading member 19 having the circuit board 22. Note that the module 200 is attached so that a plurality of pins 11 are connected to the external circuit board 22 and also the bottom surface 21 of the stem 4 is connected directly to the heat spreading member 19.

The aforementioned optical semiconductor array module 200 in the second embodiment of the present invention is substantially identical with the aforementioned first embodiment with respect to other structures, fabrication processes, and procedures. Accordingly, even in this second embodiment, the same advantageous effects as the first embodiment are obtainable. In addition to this, the external circuit board 22 and heat spreading member 19 which are connected to the module 200 can be provided in the same direction. Moreover, if the external circuit board 22 is previously connected to the heat spreading member 19 and they are formed into one united body, then this embodiment will have the advantage that an area to which the module 200 is attached can be further reduced and also the attaching can be facilitated.

An optical semiconductor array module 300 of a third embodiment of the present invention will be described with reference to FIG. 8. This third embodiment, as evident in the figure, is characterized in that the pins 11, mounted in the interior circuit board 5 of the optical semiconductor array module 100 in the first embodiment shown in FIGS. 1 and 2, are extended and provided on both sides of the package case. Even in this embodiment, the same reference numerals will be applied to parts identical with or equal to those of the aforementioned first embodiment.

Figure 8:
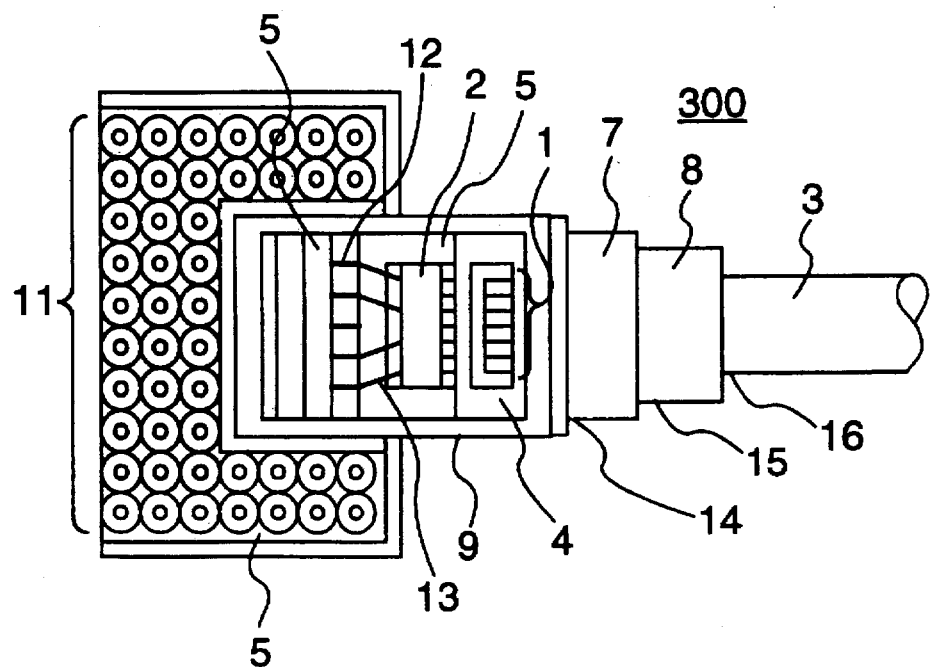
FIG. 8 is a plan view showing the structure of an optical semiconductor array module which is a third embodiment of the present invention.

As described above, in the optical semiconductor array module 300 shown in FIG. 8, the main point differing from the first embodiment is that the pins 11 for an external electric connection are also provided in both directions of the package case. More specifically, the interior circuit board 5, placed on the top surface of the stem 4, is formed so as to protrude in both directions of the package case, and on this interior circuit board 5, tens of pins 11 are arrayed in the same way as a pin grid array package where pins are arrayed at intervals of 0.1 inch.

The aforementioned optical semiconductor array module 300 shown in FIG. 8 is substantially identical with the aforementioned first embodiment with respect to other structures, fabrication processes, and procedures. Accordingly, even in this embodiment, the same advantageous effects as the first embodiment are obtainable. In addition to this, because the number of pins 11 for an external electric connection can be increased, this embodiment has the advantage that a wide variety of electrical signals can be received and transmitted, the number of transmission channels can be increased and also large amounts of data can be transmitted.

Figure 9:
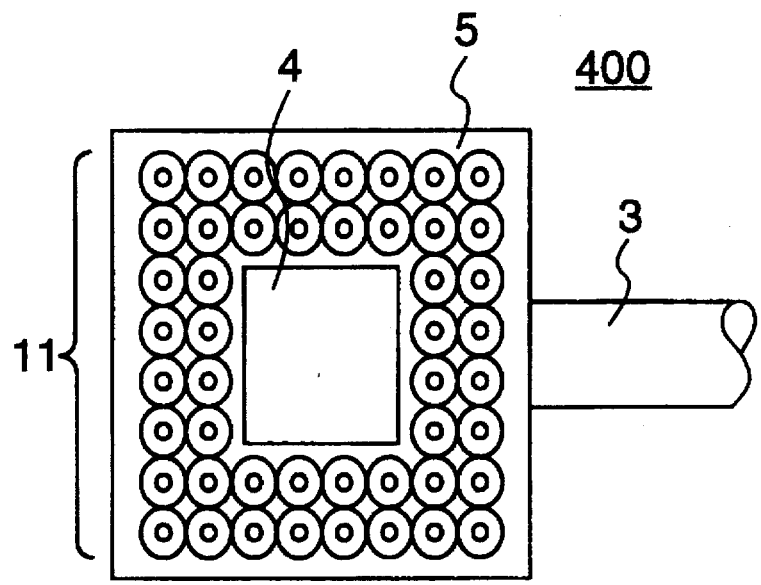
FIG. 9 is a plan view showing the pin structure of an optical semiconductor array module which is a fourth embodiment of the present invention.

A fourth embodiment of the present invention will be described with reference to FIG. 9. FIG. 9 is a plan view of an optical semiconductor array module 400. As evident in the figure, a plurality of pins 11, arrayed on an interior circuit board 5 which constitutes the package case of the optical semiconductor array module 400, is further extended so as to surround the periphery of the package case, and the array of these pins 11 is shown in the plan view.

The optical semiconductor array module 400 shown in FIG. 9 differs from the aforementioned first embodiment in that in order to form a terminal portion, the aforementioned interior circuit board 5 does not extend only from a surface opposite to the surface of the package case from which an optical fiber array 3 is taken out, but extends four surfaces surrounding the package case, excluding a surface (i.e., the bottom surface of a stem 4) on which a laser diode array 1 and an IC 2 are mounted and a surface (cap 10) opposite to this surface, among six surfaces forming the package case. On the surface of the extended interior circuit board 5, the plurality of pins 11 are mounted so that pin grid array terminals are disposed around the bottom surface of the stem 4.

That is, on the central portion of the interior circuit board 5, the stem 4 on which the laser diode array 1 and the IC 2 are mounted is positioned, and on the interior circuit board 5 extending from the circumference of the stem 4, the plurality of pins 11 are disposed. Also, the plurality of pins 11 extend from the four surface, including the surface from which the optical fiber array 3 is taken out, and are arrayed in at least two rows or three rows at intervals of 0.1 inch in the same way as a pin grid array terminal shape. Accordingly, a connection to the external circuit board 22 can be made by making use of one entire surface of the module 400, and a connection, in a state where one end of the module 400 floats or in a state the module 400 is loosely attached, can be prevented. Thus, the module 400 can be attached in a stable state.

Figure 10:
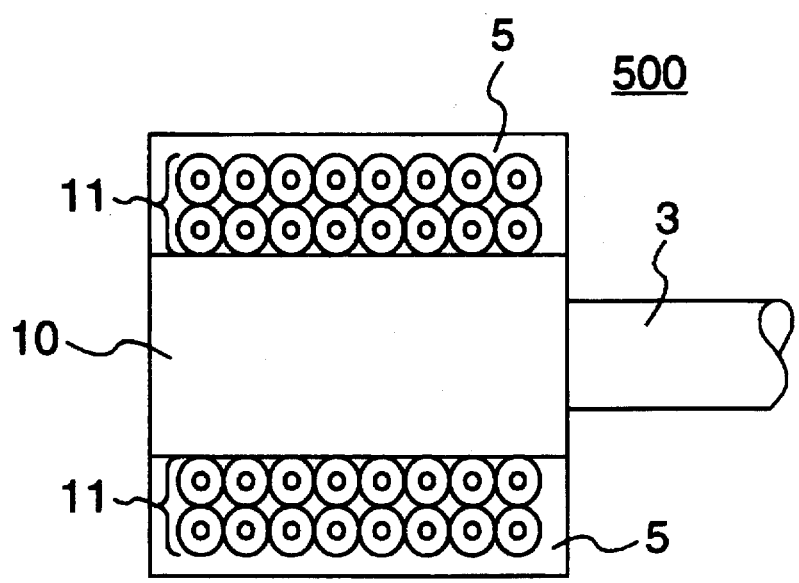
FIG. 10 is a plan view showing the pin structure of an optical semiconductor array module which is a fifth embodiment of the present invention.

A fifth embodiment of the present invention will be described with reference to FIG. 10. In this embodiment, the shape of the array of a plurality of pins 11 arrayed on an interior circuit board 5 further differs from that of the fourth embodiment. FIG. 10 shows a plan view showing the array of the plurality of pins 11. Even in this embodiment, the same reference numerals will be applied to parts identical with or equal to those of the aforementioned fourth embodiment.

In the optical semiconductor array module 500 shown in FIG. 10, the main point differing from the aforementioned fourth embodiment is that the plurality of pins 11 are not provided around a cap 10 which hermetically seals the interior of the package case, but are provided on both sides (the upper and lower sides in FIG. 10) of the package case. More specifically, the interior circuit board 5 which constitutes part of the package case is extended from the two surfaces which cross at right angles with the surface from which the aforementioned fiber array 3 is taken out and which oppose each other, among six surfaces which form the package case. Accordingly, on both sides across the cap 10, the plurality of pins 11 are arrayed in at least two parallel rows and in the same way as a pin grid array package where pins 11 are arrayed at intervals of 0.1 inch. Also, the other structures are identical with the fourth embodiment, and even in this embodiment, the same advantageous effects as the fourth embodiment are obtainable.

In the aforementioned fourth and fifth embodiments, a plurality of pins 11 are provided on the bottom surface of the stem 4 where the laser diode array 1 and the IC 2 are directly mounted, or on both sides of the cap 10 for hermetically sealing the laser diode array 1 and IC 2 mounted in the interior of the package case. Furthermore, in the aforementioned fifth embodiment, the direction in which the pins 11 are mounted is opposite to the aforementioned direction, that is, the pins 11 and the heat spreading member 19 are attached in the same direction. Even in either case, the same advantageous effects as the aforementioned embodiment are obtainable by arraying the pins 11 on both sides of the heat spreading member 19.

A sixth embodiment of the present invention will be described with reference to FIG. 11. This sixth embodiment differs from the aforementioned first embodiment (Where the laser diode array 1 is mounted at a position away from the IC 2) in that the laser diode array 1 is mounted on the top surface of the IC 2.

Figure 11:
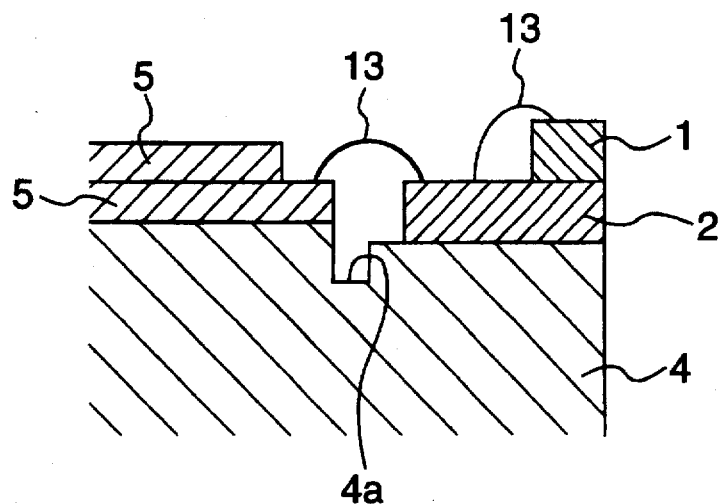
FIG. 11 is a partly-enlarged view showing the mounting structure between a semiconductor laser diode, light-emitting diode and photo diode array device and an IC, which is a sixth embodiment of the present invention.

FIG. 11 is a vertical cross-sectional view of the structure where the laser diode array 1 and the IC 2, which are the essential parts of the optical semiconductor array module in the sixth embodiment, are attached. Even in this embodiment, the same reference numerals will be applied to parts identical with or equal to those of the aforementioned first embodiment.

In FIG. 11, the main point differing from the aforementioned first embodiment is that the IC 2 is mounted on the top surface of the stem 4 and also the laser diode array 1 is mounted on the top surface of the IC 2. More specifically, the IC 2 is fixed at a predetermined position on the electric wiring provided on the top surface of the stem 4 and also the laser diode array 1 is fixed at a predetermined position on the electric wiring provided on the top surface of the IC 2. As shown in FIG. 11, the IC 2 and the laser diode array 1 are electrically connected together by a wire bonding lead 13. Likewise, the IC 2 and the interior circuit board 5 are electrically connected together by a wire bonding lead 13.

The other structures, fabrication processes, procedures, and mounted structure of the sixth embodiment are substantially identical with those of the aforementioned first embodiment. Accordingly, the same advantageous effects as the aforementioned first embodiment are obtained. In addition to these advantageous effects, the wire bonding lead 13 can be further shortened and this reduction in the lead makes it possible to operate the laser diode array 1 at a high speed with high frequency, because the laser diode array 1 and the IC 2 can be formed into one united body. Furthermore, by forming the laser diode array 1 and the IC 2 into one united body, the miniaturization and high integration of the module can be achieved at the same time.

Figure 12:
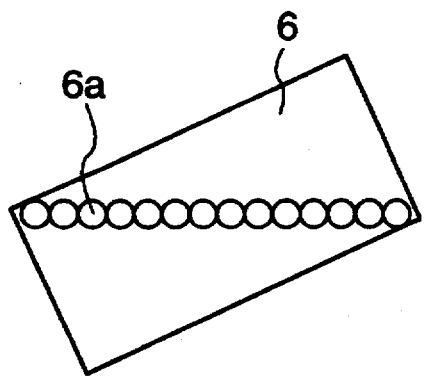
FIG. 12 is a front view showing the structure of a lens array plate which is a seventh embodiment of the present invention.

A seventh embodiment of the present invention will be described with reference to FIG. 12. In FIG. 12, the structure of a lens array plate 6 which is the essential part of the optical semiconductor array module is shown by a front view. In FIG. 12 a plurality of lenses 6a are arranged on the diagonal line of the lens array plate 6 consisting of a generally flat shape. That is, the lens array plate 6 is of a generally rectangular flat shape, and the lenses 6a are arranged at equal intervals so that the centers of the lenses 6a are aligned with the diagonal line of the lens array plate 6. According to this arrangement, the lenses 6a can be arranged more in number than a constitution where a plurality of lenses 6a are arranged in parallel with the side surface of the generally flat shape. In addition, in a case where the numbers of lenses 6a are the same, the lens array plate 6 can be made smaller by arranging the lenses 6a on the diagonal line. Accordingly, the size of the lens array plate supporting member 7 to which the lens array plate 6 is attached can be reduced. Furthermore, the size of the optical semiconductor array module can also be reduced.

An eighth embodiment of the present invention will be described with reference to FIG. 13. The structure of a lens array plate 66 in this embodiment differs from that of the seventh embodiment. Even in this embodiment, the same reference numerals will be applied to parts identical with or equal to those of the aforementioned seventh embodiment.

Figure 13:
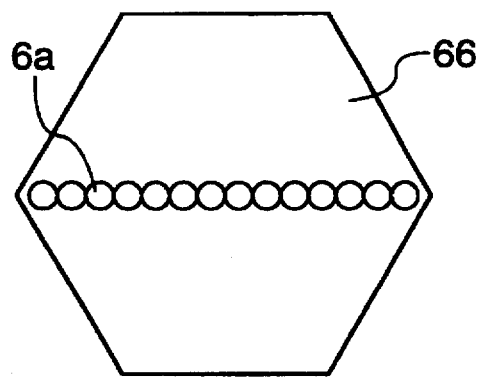
FIG. 13 is a front view showing the structure of a lens array plate which is an eighth embodiment of the present invention.

As evident in FIG. 13, the lens array plate 66 which is the essential part of the optical semiconductor array module is different from the lens array plate 6 of the aforementioned seventh embodiment in that the lens array plate 6 of the seventh embodiment is of a generally rectangular flat shape, while the lens array plate 66 of this embodiment is of a generally hexagonal flat shape. Furthermore, a plurality of lenses 6a are arranged at equal intervals so that the centers of the lenses are aligned with the diagonal line of this hexagon. The other structures are identical with the aforementioned seventh embodiment, and even in this embodiment, the same advantageous effects as the seventh embodiment are obtainable.

Finally, a ninth embodiment of the present invention will be described with reference to FIGS. 14 and 15. An optical semiconductor array module in this embodiment is characterized in that a lens array plate supporting member 7 for supporting a lens array plate 6 is constituted by a member consisting of at least two metallic materials. Even in this embodiment, the same reference numerals will be applied to parts identical with or equal to those of the aforementioned first embodiment.

Figure 14:
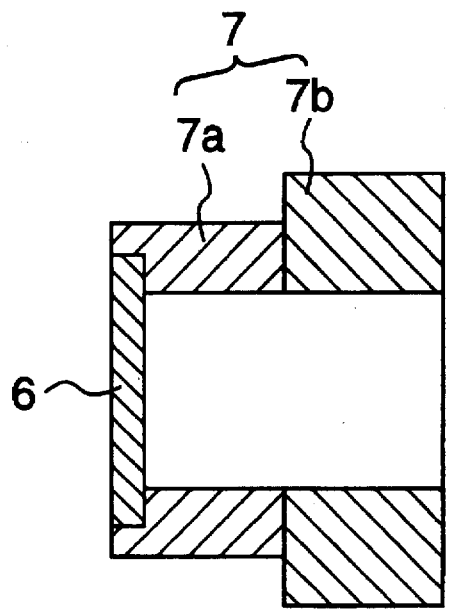
FIG. 14 is a longitudinal sectional view showing the structure of a lens array plate supporting member which is a ninth embodiment of the present invention.
Figure 15:
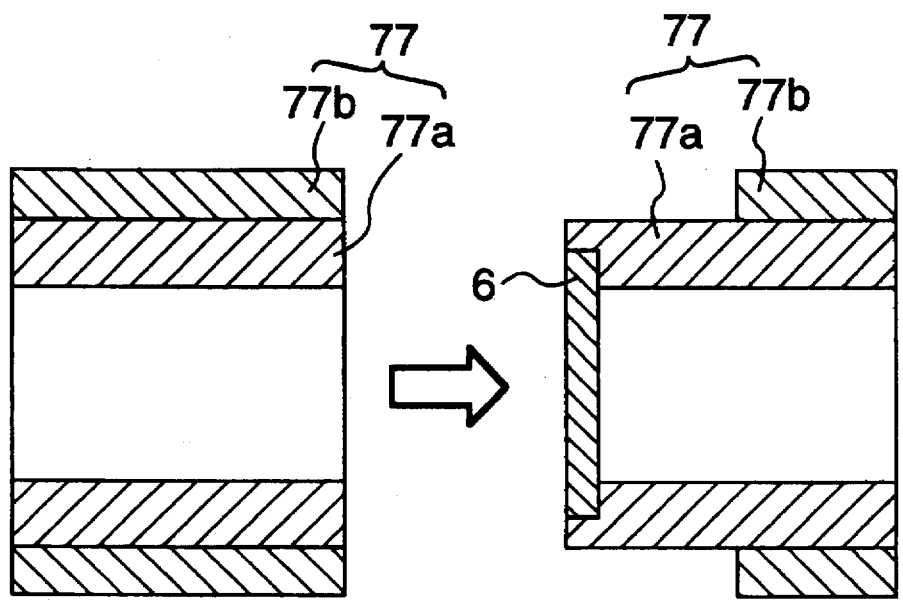
FIG. 15 is a longitudinal sectional view showing the structure of another lens array plate supporting member which is the ninth embodiment of the present invention.
Figure 16:
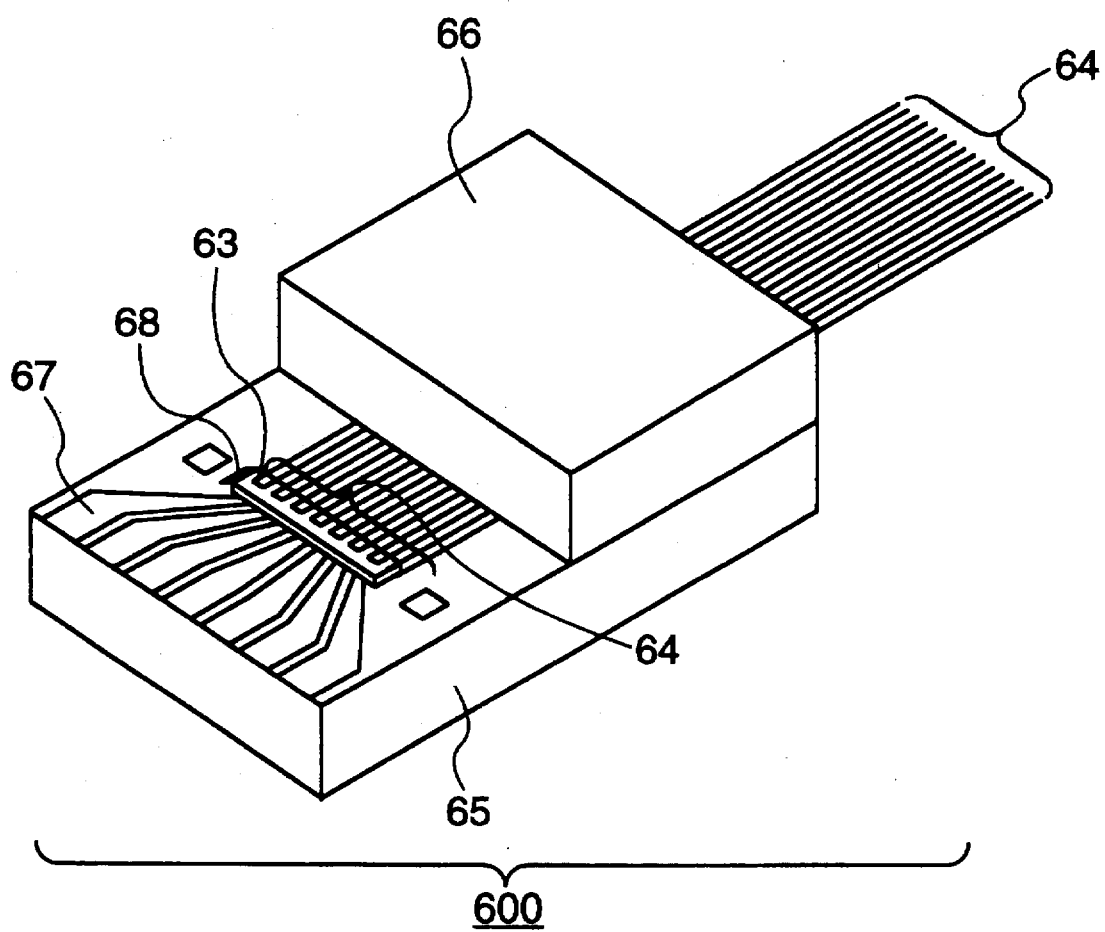
FIG. 16 is a perspective view showing the structure of a conventional, optical semiconductor array module.
Figure 17A:
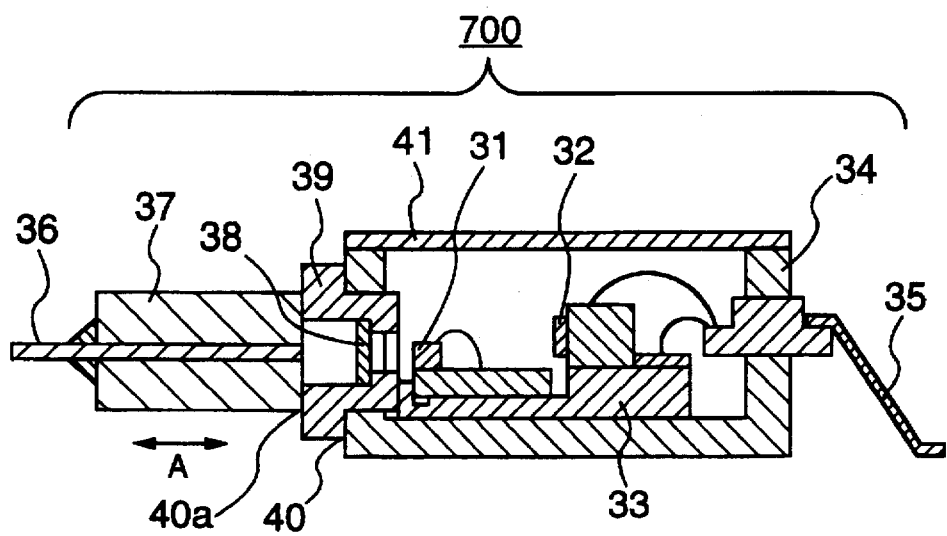
FIG. 17A is a sectional view taken along A—A of FIG. 17B showing the structure of another conventional, optical semiconductor array module.
Figure 17B:
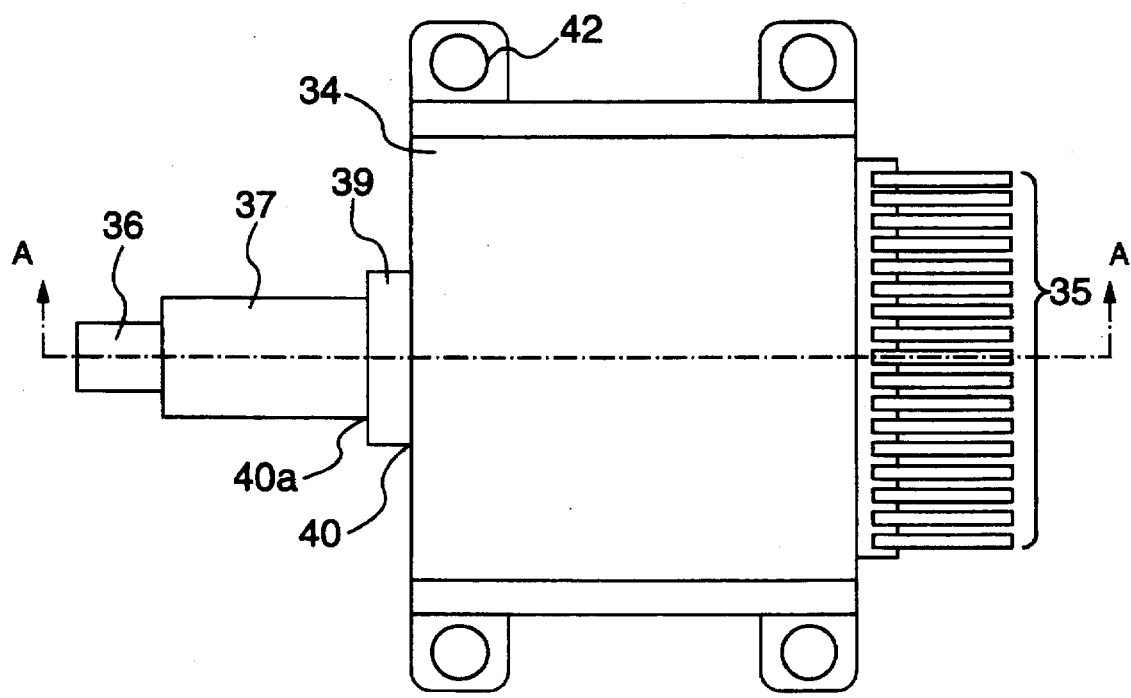
FIG. 17B is a plan view showing the structure of the conventional, optical semiconductor array module.
Figure 18:
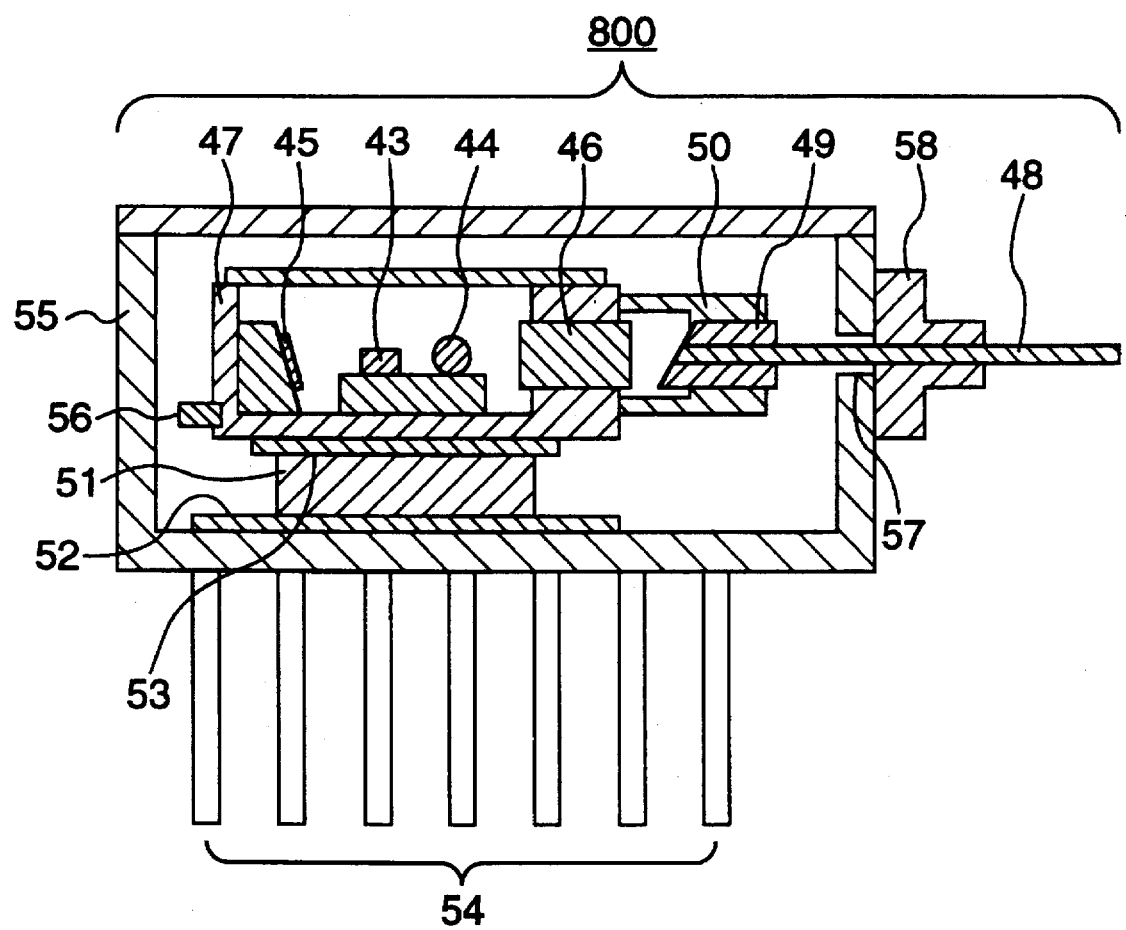
FIG. 18 is a sectional view showing the structure of still another conventional, optical semiconductor array module.

In the lens array plate supporting member 7 shown in FIG. 14, the main point differing from the aforementioned first embodiment is that the lens array plate supporting member 7 is constituted by a member consisting of at least two metallic materials. More specifically, a portion 7a to which the lens array plate 6 is attached and a portion 7b which is joined and fixed to the side wall 9 of the package case are constituted by different metallic materials, respectively. The respective metallic materials are constituted by metallic materials where a difference in thermal expansion coefficient, between a glass material constituting the lens array plate 6 and a metallic material constituting the side wall 9 of the package case, is less than $3 \times 10^{-6}$/°C. That is, even in a case where the glass material constituting the lens array plate 6 and the metallic material constituting the side wall 9 of the package case have considerably different thermal expansion coefficients, they can be satisfactorily joined and fixed to the lens array plate 6 and the side wall 9 of the package case by constituting the lens array plate supporting member 7 by a member consisting of at least two metallic materials.

The lens array plate supporting member 7 may be formed by a metal injection molding method which sinters and molds metallic powder. The present invention is not limited to this method. For example, the lens array plate supporting member 7 may be formed by silver soldering. Furthermore, a lens array plate supporting member 77 such as that shown in FIG. 15 may be constituted by two circular tubes 77a and 77b, and this may be formed by mechanical processing. As the respective metallic materials which constitute the lens array plate supporting members 7 and 77, it is, for example, preferable that the lens array plate 6 is constituted by stainless steel SUS 430 and also the side wall 9 of the package case is constituted by a kovar which is a Fe—Ni—Co alloy. In addition, the lens array plate supporting member may be constituted by a combination of metallic materials which satisfies the aforementioned difference in thermal expansion coefficient. When the side wall 9 of the package case is constituted by a kovar which is a Fe—Ni—Co alloy, a welding defect in the portion welded by YAG laser welding can be prevented. Therefore, it is desirable that a metallic material constituting the through hole 9a of the side wall 9 of the package case, a metal layer constituting the interior circuit board 5 consisting of the aforementioned multilayered structure, and a metallic material constituting the aforementioned optical fiber array guide 8 will also be constituted by a combination of metallic materials which satisfies the aforementioned difference in thermal expansion coefficient, such as a kovar.

While, in the aforementioned first, second, third, fourth, fifth, and sixth embodiments, the laser diode array 1 has been used as a plurality of semiconductor laser diode, light-emitting diode elements, the present invention is not limited to this laser diode array 1. For example, a light-emitting diode array consisting of a plurality of semiconductor laser diode, light-emitting diode elements, or a photodiode array consisting of a plurality of semiconductor photo diode elements may be used. Even in this case, the same advantageous effects as the aforementioned embodiments can be obtained.

In the aforementioned first and second embodiments, stainless steel SUS 430 has been used as material constituting the through hole 9a of the side wall 9 and also as material constituting the lens array plate supporting member 7 and the optical fiber array guide 8. However, the present invention is not limited to stainless steel SUS 430. For example, a Fe-50% Ni which is an alloy of Fe and Ni, or a kovar which is an alloy of Fe, Ni, and Co may be used. Even in these cases, the same advantageous effects as the aforementioned embodiments can be obtained.

In the aforementioned first, second and third embodiments, the stem 4 has been constituted by an alloy of copper and tungsten. However, the present invention is not limited to this alloy. For example, an alloy of aluminum and silicon carbide, aluminum nitride, an alloy of aluminum and silicon, copper and an invar composite metal, or silicon may be used. Even in these cases, the same advantageous effects as the aforementioned embodiments can be obtained.

In the aforementioned first, second, third, fourth, and fifth embodiments, the interior circuit board 5 has been constituted by stacking a plurality of ceramic boards. For example, it is preferable that aluminum nitride or silicon carbide is used as a ceramic board. Also, this material is not limited to ceramic. Instead of ceramic, for example, glass or silicon may be used. Even in these cases, the same advantageous effects as the aforementioned embodiments can be obtained.

In the aforementioned first, second, third, fourth, and fifth embodiments, a plurality of pins 11 has been arrayed in the same way as a pin grid array package where pins are arrayed in the form of a grid. However, the present invention is not limited to the array of the pins 11 shown in the aforementioned first, second, third, fourth, and fifth embodiments. The plurality of pins 11 may be arrayed in the form of a pin grid array other than these cases. Even in this case, the same advantageous effects as the aforementioned embodiments can be obtained.

In the aforementioned first, second, third, fourth, fifth, and sixth embodiments, a description has been made of the optical semiconductor array module where the laser diode array 1, constituted by twelve semiconductor laser diode, light-emitting diode elements arrayed in a row at equal intervals, is optically coupled to the optical fiber array 3 constituted by twelve single-mode optical fibers arrayed in parallel at equal intervals and where twelve channels of transmission data are optically transmitted in parallel at the same time. However, the present invention is not limited to this optical semiconductor array module. For example, the present invention may be constituted by an optical semiconductor array module where four channels, six channels, eight channels, or ten channels of transmission data are optically transmitted in parallel. Even in this case, the same advantageous effects as the aforementioned embodiments can be obtained.

As has been described, the present invention provides an optical semiconductor array module, an fabrication method thereof, and an external board mounting structure thereof, where handling of the module and attaching to both an external circuit board and a spreading member are excellent and which is capable of assuring reliability in an incorporated semiconductor laser diode, light-emitting diode and photo diode element array, while overcoming the problems in the aforementioned prior art.

More specifically, according to the present invention, a plurality of pins electrically connected to a laser diode array are arrayed in the form of a pin grid array terminal. These pins are mounted in a terminal portion which extends from at least one surface of the side surfaces of the package case. Even if the pins are increased to tens, they could be arrayed at desired intervals without increasing the size of the module which includes the package case. Because the pins are arrayed in the form of a pin grid array terminal, a connection to circuit boards being widely used can be generalized. Moreover, since there is no need of providing a structure where a special heat spreading member is attached to an external circuit board and also a heat spreading member can be directly connected without interfering the pins, heat spreading of heat from the module can be efficiently performed and a mounting area of the module to the external circuit board can be equalized with the outer dimension of the module. Furthermore, because a connection to the external circuit board is made by inserting pins, the module is mechanically and electrically connected and fixed with ease and reliability, and stable optical transmission, which eliminates deformation of the package case and prevents optical coupling degradation caused by misalignment, is obtained.

In addition, according to the concrete constitution of the optical semiconductor array module, fabrication method, external board mounting structure of the present invention, a lens array plate supporting member is joined and fixed to the side wall of the package case, and also an optical fiber array, which is optically coupled to semiconductor laser diode, light-emitting diode and photo diode elements mounted on the package case, is provided outside the package case. Furthermore, a cap is fixed to the top of the side wall of the package case. Accordingly, the semiconductor laser diode, light-emitting diode and photo diode elements and the IC of the package case can be hermetically sealed and degradation of the interior elements caused by environment can be prevented. Furthermore, by electrically connecting the laser diode array and the pins together through the interior circuit board of the module, the connection distances at the wiring bonding leads can be shortened and equalized, and high-speed and high-frequency driving of the laser diode array and also stable parallel optical transmission where a difference between propagation delay times is reduced can be performed. Also, by forming the module into a box shape, handling and operability can be facilitated. In addition, by using a single-mode fiber as an optical fiber, high-speed and long-distance transmission can be realized with low transmission loss, and the module can transmit large amounts of data.

According to the present invention, a lens array holder is joined and fixed to the side wall of the package case, and also an optical fiber array, which is optically coupled to semiconductor laser diode, light-emitting diode and photo diode elements array mounted on the package case, is provided outside the package case. Furthermore, a cap is fixed to the top of the side wall of the package case. Accordingly, the semiconductor laser diode, light-emitting diode and photo diode elements array and the IC of the package case can be hermetically sealed. In addition, the semiconductor laser diode, light-emitting diode and photo diode element array are connected to the electrode leads through the electric wiring and the electronic device of the electrode board member, whereby bonding lines can be shortened and also can be easily attached. Moreover, high-speed and high-frequency driving of the semiconductor laser diode, light-emitting diode and photo diode element array can be performed. Furthermore, the electrode leads are arrayed only from one flat surface of the electrode board member. Accordingly, the electrode leads do not need to be arrayed horizontally from both sides of the package as a conventional technique does. At this time, the electrode leads can be formed on the top surface of the electrode board member in the same manner as the pin array and pin intervals of a dual in-line package. Therefore, the electrode leads can be arrayed in an integrated state and the mounting of the electrode leads to currently used IC boards can be generalized. Furthermore, a stem which is a heat spreading member can be provided in the direction opposite to the direction in which the electrode leads are taken out, whereby a connection to both an integrated circuit board and heat spreading fins can be performed through the top and bottom surfaces of the module. Therefore, the mounting of the module to an integrated circuit board and the heat spreading of the module can be easily and efficiently performed. Also, by forming the module into a box shape, handling and operability can be facilitated.

Accordingly, the present invention can provide an optical semiconductor array module and an fabrication method thereof where handling of the module and mounting of the module on an integrated circuit board and heat spreading fins are excellent and which is capable of assuring reliability in a semiconductor laser diode, light-emitting diode and photo diode element array.

What is claimed is:

1. An optical semiconductor array module comprising:
    an optical semiconductor array device constituted by a plurality of semiconductor laser diode, light-emitting diode elements or a plurality of semiconductor photo diode elements;
    an electronic device for driving and controlling said optical semiconductor array device;
    a cube-shaped package case for housing said optical semiconductor array device and said electronic device therein;
    an optical fiber array optically coupled to said optical semiconductor array device;
    a supporting member for holding and fixing said optical fiber array to one surface of said cube-shaped package case;
    coupling means for optical coupling said optical semiconductor array device and said optical fiber array together; and
    a terminal portion having a plurality of pins for electrically connecting an external circuit board to said electronic device,
    wherein said terminal portion is formed by extending said terminal portion from at least one of surfaces forming said package case, excluding a surface on which said optical semiconductor array device and said electronic device are mounted and a surface opposite to that surface, and said plurality of pins are mounted in a surface of said terminal portion which crosses at right angles with a surface from which said optical fiber array is taken out, whereby said electronic device is mounted on said external circuit board through said plurality of pins and is electrically connected to said external circuit board.

2. An optical semiconductor array module according to claim 1, wherein said terminal portion having said plurality of pins mounted therein is formed by extending said terminal portion from (1) a surface opposite to the surface of said package case from which said optical fiber array is taken out, and/or (2) a plurality of surfaces of said package case, excluding the surface from which said optical fiber array is taken out, and/or (3) a plurality of surfaces of said package case, excluding the surface from which said optical fiber array is taken out and a surface opposite to that surface.

3. An optical semiconductor array module according to claim 1, wherein a heat spreading member is attached to the surface of said package case on which said optical semiconductor array device and said electronic device are mounted inside.

4. An optical semiconductor array module according to claim 1, wherein said plurality of pins, mounted in said terminal portion, are mounted in (1) a direction of the surface of said package case on which said optical semiconductor array device and said electronic device are mounted, and/or (2) a direction of the surface opposite to the surface of said package case on which said optical semiconductor array device and said electronic device are mounted inside.

5. An optical semiconductor array module according to claim 1, wherein said plurality of pins, mounted in the surface of said terminal portion, are arrayed at least two rows.

6. An optical semiconductor array module according to claim 1, wherein said plurality of pins, mounted in the surface of said terminal portion, are arrayed at least three rows and three columns.

7. An optical semiconductor array module according to claims 5 or 6, wherein the pins, mounted in the surface of said terminal portion, are aligned so that an interval, between the centers of adjacent pins, is between 1.0 mm and 3.0 mm.

8. An optical semiconductor array module according to claim 7, wherein the pins, mounted in the surface of said terminal portion, are aligned so that an interval, between the centers of adjacent pins, is 2.54 mm.

9. An optical semiconductor array module according to claim 1, wherein said cube-shaped package case where said optical semiconductor array device and said electronic device are housed is isolated from the outside and hermetically sealed.

10. An optical semiconductor array module according to claim 1, wherein said terminal portion in which said plurality of pins are mounted is constituted by part of a member which forms part of said package case.

11. An optical semiconductor array module according to claim 1, wherein a circuit element for adjusting electric characteristics of said electronic device is attached to a surface opposite to the surface of said terminal portion in which said pins are mounted.

12. An optical semiconductor array module according to claim 1, wherein a member, which constitutes part of said package case and has said optical semiconductor array device or said electronic device mounted on the inner surface, is formed by at least one material of an alloy of copper and tungsten, an alloy of aluminum and silicon carbide, aluminum nitride, an alloy of aluminum and silicon, composite metal of copper and invar, and silicon.

13. An optical semiconductor array module according to claim 10, wherein a member, which constitutes part of said package case and has a portion which constitutes said terminal portion, is constituted by a multilayered structure formed with a plurality of boards where an electric sheet can be provided on each surface.

14. An optical semiconductor array module according to claim 13, wherein said multilayered member, which constitutes part of said package case and has a portion which constitutes said terminal portion, is constituted by a combination of at least one of ceramic, glass, silicon, and a metal conductor containing a Fe—Ni—Co alloy.

15. An optical semiconductor array module according to claim 13, wherein said multilayered member, which constitutes part of said package case and has a portion which constitutes said terminal portion, has electric wires for electrically connecting said optical semiconductor array device and said pins together through said electronic device.

16. An optical semiconductor array module according to claim 1, wherein said coupling means for optically coupling said optical semiconductor array device and said optical fiber array together is constituted by a lens array plate where the number of lenses corresponding in number to elements of said optical semiconductor array device are arranged on a line.

17. An optical semiconductor array module according to claim 16, wherein said lens array plate is of a generally rectangular flat shape and said plurality of lenses are arranged on the diagonal line of said generally rectangular flat shape at equal intervals.

18. An optical semiconductor array module according to claim 16, wherein a lens array plate supporting member for supporting said lens array plate is formed from at least two metallic members consisting of a member to which said lens array plate is directly fixed and a member which is joined and fixed to a side wall of said package case.

19. An optical semiconductor array module comprising:
at least one of optical semiconductor array devices, the devices being constituted by a plurality of semiconductor laser diode, light-emitting diode elements or a plurality of semiconductor photo diode elements;
an electronic device for driving said at least one optical semiconductor array device;
an optical fiber array optically coupled to said at least one optical semiconductor array device, the optical fiber array being constituted by a plurality of optical fibers for performing optical transmission;
a lens array constituted by a plurality of lenses for optically coupling said at least one optical semiconductor array device and said optical fiber array so that they are in an optical transmission relationship;
a lens array supporting member for supporting and fixing said lens array, the lens array supporting member being connected to a package where said at least one optical semiconductor array device and said electronic device are housed; and
an optical fiber array supporting member for supporting and fixing said optical fiber array, the optical fiber array supporting member being connected to said package through said lens array supporting member,
wherein said package, which houses said one optical semiconductor array device and said electronic device, is constituted by a heat spreading member on which said at least one semiconductor array device is mounted, a multilayered electrode board member on which said electronic device is mounted and which is electrically connected to said at least one semiconductor array device through said electronic device, a side wall to which said lens array supporting member is connected and which is provided so as to surround said at least one semiconductor array device and said electronic device, and a cap fixed on the top of said side wall so that an inner space defined in said side wall is isolated from the outside,
electrode pins, which are provided on said multilayered electrode board member and are electrically connected to said at least one semiconductor array device, are taken out only from one flat surface of said multilayered electrode board member and are disposed in the same direction as said cap fixed on the top of said package, and
said heat spreading member is disposed in a direction opposite to the direction in which said electrode pins are taken out.

20. An optical semiconductor array module according to claim 19, wherein said electrode pins, provided on said electrode board member, are arrayed in the same manner as the pin array and pin intervals of electrode pins of a dual in-line package.

21. An optical semiconductor array module according to claim 19, wherein said electrode board member has electric wires for electrically connecting said at least one optical semiconductor array device and said electrode pins together through said electronic device.

22. An optical semiconductor array module according to claim 19, wherein said heat spreading member is constituted by at least one material of an alloy of copper and tungsten, copper, and silicon.

23. An optical semiconductor array module according to claim 19, wherein said multilayered electrode board member is constituted by at least one material of ceramic, glass, and silicon.

24. An optical semiconductor array module according to claim 19, wherein said lens array is of a generally rectangular flat shape and said plurality of lenses are arranged on the diagonal line of said generally rectangular flat shape at equal intervals.

25. An optical semiconductor array module according to claim 19, wherein said lens array plate supporting member is formed from at least two metallic members consisting of a member to which said lens array is connected and fixed and a member which is joined and fixed to the side wall of said package.

26. An optical semiconductor array module comprising:
an optical semiconductor array device constituted by a plurality of semiconductor laser diode, light-emitting diode elements or a plurality of semiconductor photo diode elements;
an electronic device for driving and controlling said optical semiconductor array device;
a cube-shaped package case for housing said optical semiconductor array device and said electronic device therein;
an optical fiber array optically coupled to said optical semiconductor array device;
a supporting member for holding and fixing said optical fiber array to one surface of said cube-shaped package case;
coupling means for optically coupling said optical semiconductor array device and said optical fiber array together; and
a terminal portion having a plurality of pins for electrically connecting an external circuit board to said electronic device,
wherein said plurality of pins are mounted in a surface of said terminal portion and are arrayed in the form of a pin grid array where pins are vertically mounted and arrayed in the form of a grid.

27. An optical semiconductor array module according to claim 26, wherein said terminal portion is formed by extending said terminal portion from at least one of surfaces forming said package case, excluding a surface on which said optical semiconductor array device and said electronic device are mounted inside and a surface opposite to that surface, and said plurality of pins are mounted in a surface of said terminal portion which crosses at right angles with a surface from which said optical fiber array is taken out, whereby said electronic device is mounted on said external circuit board through said plurality of pins and is electrically connected to said external circuit board.

28. An optical semiconductor array module according to claim 26, wherein said terminal portion having said plurality of pins mounted therein is formed by extending said terminal portion from (1) a surface opposite to the surface of said package case from which said optical fiber array is taken out, and/or (2) a plurality of surfaces of said package case, excluding the surface from which said optical fiber array is taken out, and/or (3) a plurality of surfaces of said package case, excluding the surface from which said optical fiber array is taken out and a surface opposite to that surface.

29. An optical semiconductor array module according to claim 26, wherein a heat spreading member is attached to the surface of said package case on which said optical semiconductor array device and said electronic device are mounted inside.

30. An optical semiconductor array module according to claim 26, wherein said plurality of pins, mounted in said terminal portion, are mounted in (1) a direction of the surface of said package case on which said optical semiconductor array device and said electronic device are mounted, and/or (2) a direction of the surface opposite to the surface of said package case on which said optical semiconductor array device and said electronic device are mounted inside.

31. An optical semiconductor array module according to claim 26, wherein said plurality of pins, mounted in the surface of said terminal portion, are arrayed in four parallel rows in the same direction as the direction in which said optical fiber array is taken out.

32. An optical semiconductor array module according to claim 26, wherein said plurality of pins, mounted in the surface of said terminal portion, are arrayed at least two parallel rows.

33. An optical semiconductor array module according to claims 31 or 32, wherein the pins, mounted in the surface of said terminal portion, are disposed so that an interval, between the centers of adjacent pins, is between 1.0 mm and 3.0 mm.

34. An optical semiconductor array module according to claim 33, wherein the pins, mounted in the surface of said terminal portion, are disposed so that an interval, between the centers of adjacent pins, is 2.54 mm.

35. An optical semiconductor array module according to claim 26, wherein said cube-shaped package case where said optical semiconductor array device and said electronic device are housed is isolated from the outside and hermetically sealed.

36. An optical semiconductor array module according to claim 26, wherein said terminal portion in which said plurality of pins are mounted is constituted by part of a member which forms part of said package case.

37. An optical semiconductor array module according to claim 26, wherein a circuit element for adjusting electric characteristics of said electronic device is attached to a surface opposite to the surface of said terminal portion in which said pins are mounted.

38. An optical semiconductor array module according to claim 26, wherein a member, which constitutes part of said package case and has said optical semiconductor array device and said electronic device mounted on the inner surface, is formed by at least one material of an alloy of copper and tungsten, an alloy of aluminum and silicon carbide, aluminum nitride, an alloy of aluminum and silicon, composite metal of copper and invar, and silicon.

39. An optical semiconductor array module according to claim 36, wherein said member, which constitutes part of said package case and has a portion which constitutes said terminal portion, is constituted by a multilayered structure formed with a plurality of boards where an electric sheet can be provided on each surface.

40. An optical semiconductor array module according to claim 39, wherein said member, which constitutes part of said package case and has a portion which constitutes said terminal portion and which is constituted by a multilayered structure formed with a plurality of boards where an electric sheet can be provided on each surface, is formed in the form of steps in the interior of the package case so that the electric sheet formed in each board is exposed to a surface of each board, and wherein said electric sheet exposed to each board surface is electrically connected to said electronic device.

41. An optical semiconductor array module according to claim 39, wherein said multilayered member, which constitutes part of said package case and has a portion which constitutes said terminal portion, is constituted by a combination of at least one of ceramic, glass, and silicon, and a metal conductor containing a Fe—Ni—Co alloy.

42. An optical semiconductor array module according to claim 39, wherein said multilayered member, which constitutes part of said package case and has a portion which constitutes said terminal portion, has electric sheets for electrically connecting said optical semiconductor array device and said pins together through said electronic device.

43. An optical semiconductor array module according to claim 26, wherein said coupling means for optically coupling said optical semiconductor array device and said optical fiber array together is constituted by a lens array plate where the number of lenses corresponding in number to elements of said optical semiconductor array device are arranged on a line.

44. An optical semiconductor array module according to claim 43, wherein said lens array plate is of a generally rectangular flat shape and said plurality of lenses are arranged on the diagonal line of said generally rectangular flat shape at equal intervals.

45. An optical semiconductor array module according to claim 43, wherein a lens array plate supporting member for supporting said lens array plate is formed from at least two metallic members comprising of a member to which said lens array plate is directly fixed and a member which is joined and fixed to a side wall of said package case.

46. A method of fabricating the optical semiconductor array module as set forth in claim 19, comprising the steps of:

on the package, which is constituted by the electrode board member provided with said heat spreading member and said electrode pins and said side wall, fixing said at least one optical semiconductor array device at a predetermined position on said heat spreading member; fixing said electronic device at a predetermined position on said electrode board member; and applying wire bonding so that said at least one optical semiconductor array device and said electrode board member are electrically connected together through said electronic device;

adjusting said lens array supporting member in a direction of a surface crossing an optical axis at right angles so that an optical axis line of said at least one semiconductor array device becomes aligned with that of said lens array, and then joining and fixing said lens array supporting member having said lens array fixed thereto to the side wall of said package;

joining and fixing said cap on the top of said side wall of said package to hermetically seal said at least one semiconductor array device and said electronic device;

emitting a laser beam between said at least one semiconductor array device and said optical fiber array through said lens array and adjusting said optical fiber array in an optical axis direction so that the optical axis line of said at least one semiconductor array device becomes aligned with that of said optical fiber array, and joining and fixing said optical fiber array to said optical fiber array supporting member;

adjusting said optical fiber array supporting member in the direction of the surface crossing the optical axis at right angles; and joining and fixing said optical fiber array supporting member to the side wall of said package through said lens array supporting member.

47. A method of fabricating an optical semiconductor array module where both an optical semiconductor array device constituted by a plurality of semiconductor laser diode, light-emitting diode elements or a plurality of semiconductor photo diode elements and an electronic device for driving and controlling said optical semiconductor array device are housed in a cube-shaped package case, an optical fiber array inserted in an optical fiber array supporting member is attached to a side surface of said package case, and an end of said optical fiber array is optically coupled to said optical semiconductor array device through a lens array having of a plurality of lenses, comprising the steps of:

mounting a board on a side wall forming part of said package case and also on an inner surface of a plate-shaped fixing member forming a bottom portion of said package case, the board forming part of said package case and having a plurality of pins mounted therein and also having said electronic device mounted thereon;

mounting said optical semiconductor array device at a predetermined position on a surface of said plate-shaped fixing member and said electronic device at a predetermined position on a surface of said board;

electrically connecting said optical semiconductor array device and said electronic device together;

attaching said lens array plate supporting member having said lens array plate fixed thereto to said side wall;

attaching a cap on the top of said side wall to hermetically seal an inner space of said side wall;

attaching said optical fiber array fixed to said optical fiber array supporting member to said side surface of said package case;

when said lens array plate supporting member having said lens array plate fixed thereto is attached to said side wall, emitting light from some of a plurality of light-emitting elements of said optical semiconductor array device and adjusting a position of said lens array plate so that the optical axis line of each element of said optical semiconductor array device becomes aligned with that of each lens of said optical fiber array plate and then joining and fixing said lens array plate by welding;

adjusting optical coupling between a laser beam being passed through said lens array plate and said optical fiber array; and joining and fixing said optical fiber array supporting member to the side wall of said package case through said lens array plate supporting member by welding.

48. An external board mounting structure for mounting the optical semiconductor array module as set forth in claim 26 on an external circuit board, wherein pins provided in a terminal portion of said optical semiconductor array module are mechanically and electrically connected to said external circuit board and also a heat spreading member is connected and fixed to a surface on which said optical semiconductor array device and said electronic device are mounted.

49. An external board mounting structure according to claim 48, wherein said optical semiconductor array module which is mechanically and electrically connected to said external circuit board is connected and fixed only by said plurality of pins provided in the terminal portion of said optical semiconductor array module.

50. A parallel optical transmission system for driving and controlling an optical semiconductor array module to perform parallel optical transmission, wherein the optical semiconductor array module as set forth in claim 1 is used as a communication means or parallel optical transmission means between computers, between exchanges, between an exchange using an optical switch and a box, between boards, between personal computers, and between work stations, or is used as a communication means or parallel optical transmission means for home image communication equipment, communication equipment for games, and vehicle control equipment.

* * * * *